(12) United States Patent
Kim et al.

(10) Patent No.: US 12,360,632 B2
(45) Date of Patent: Jul. 15, 2025

(54) DISPLAY DEVICE AND METHOD TO CORRECT TOUCH DATA OF STRETCHABLE TOUCH PANEL

(71) Applicant: LG Display Co., Ltd., Seoul (KR)

(72) Inventors: SungChul Kim, Goyang-si (KR); HoonBae Kim, Paju-si (KR); SunYeop Kim, Paju-si (KR)

(73) Assignee: LG Display Co., Ltd. (KR)

( * ) Notice: Subject to any disclaimer, the term of this patent is extended or adjusted under 35 U.S.C. 154(b) by 0 days.

(21) Appl. No.: 18/488,272

(22) Filed: Oct. 17, 2023

(65) Prior Publication Data
US 2024/0220052 A1 Jul. 4, 2024

(30) Foreign Application Priority Data
Dec. 30, 2022 (KR) .................. 10-2022-0190695

(51) Int. Cl.
*G06F 3/041* (2006.01)
*G06F 1/16* (2006.01)
*G09F 9/30* (2006.01)
*H03M 1/00* (2006.01)

(52) U.S. Cl.
CPC .......... *G06F 3/0418* (2013.01); *G06F 1/1652* (2013.01); *G06F 3/04164* (2019.05); *G09F 9/301* (2013.01); *H03M 1/001* (2013.01); *G06F 2203/04102* (2013.01)

(58) Field of Classification Search
CPC .. G06F 3/0418; G06F 3/0412; G06F 3/04166; G06F 1/1652; H03M 1/001
See application file for complete search history.

(56) References Cited

U.S. PATENT DOCUMENTS

| 2014/0160063 | A1* | 6/2014 | Yairi | G06F 3/04886 345/173 |
| 2018/0173342 | A1* | 6/2018 | Lee | G06F 3/044 |
| 2020/0211437 | A1* | 7/2020 | Ahn | H10K 59/131 |
| 2023/0147678 | A1* | 5/2023 | Wu | G09F 21/049 345/174 |

FOREIGN PATENT DOCUMENTS

KR 10-2021-0062457 A 5/2021

* cited by examiner

*Primary Examiner* — Liliana Cerullo
(74) *Attorney, Agent, or Firm* — Fish & Richardson P.C.

(57) ABSTRACT

According to an aspect of the present disclosure, a display device includes: a stretchable touch panel having a plurality of touch electrodes; a stretchable display panel configured to display an image; and a touch driver configured to operate the stretchable touch panel, in which the touch driver recognizes a stretchable area of the stretchable touch panel and corrects a touch data value of the stretchable area of the stretchable touch panel, thereby improving touch performance of the stretchable touch panel.

13 Claims, 15 Drawing Sheets

FIG. 14

DISPLAY DEVICE AND METHOD TO CORRECT TOUCH DATA OF STRETCHABLE TOUCH PANEL

CROSS-REFERENCE TO RELATED APPLICATIONS

This application claims the priority of Korean Patent Application No. 10-2022-0190695 filed on Dec. 30, 2022, in the Korean Intellectual Property Office, the disclosure of which is incorporated herein by reference.

TECHNICAL FIELD

The present disclosure relates to a display device and a method of driving the same, and more particularly, to an extendable, stretchable display device and a method of driving the same.

BACKGROUND

As display devices used for a monitor of a computer, a TV set, a mobile phone, and the like, there are an organic light-emitting display (OLED) configured to autonomously emit, and a liquid crystal display (LCD) that requires a separate light source.

The range of application of the display devices is diversified from the monitor of the computer and the TV set to personal mobile devices, and studies are being conducted on the display devices having wide display areas and having reduced volumes and weights.

In addition, recently, display devices have been made by forming display parts, lines, and the like on substrates made of flexible plastic materials and having flexibility. The display devices are manufactured to be stretchable in particular directions and variously changeable in shapes, and thus attract attention as next-generation display devices.

SUMMARY

An object to be achieved by the present disclosure is to provide a display device including a display panel and a touch panel with an improved ability to display a stereoscopic display.

Another object to be achieved by the present disclosure is to provide a display device capable of improving touch performance in a stretched state.

Objects of the present disclosure are not limited to the above-mentioned objects, and other objects, which are not mentioned above, may be clearly understood by those skilled in the art from the following descriptions.

According to an aspect of the present disclosure, a display device includes: a stretchable touch panel having a plurality of touch electrodes; a stretchable display panel configured to display an image; and a touch driver configured to operate the touch panel, in which the touch driver recognizes a stretchable area of the touch panel and corrects a touch data value of the stretchable area of the touch panel, thereby improving touch performance of the stretchable touch panel.

According to another aspect of the present disclosure, a method of driving a display device, which includes a stretchable touch panel having a plurality of touch electrodes, a stretchable display panel configured to display an image, an actuator configured to deform the display panel and the touch panel, and a touch driver having at least one electric charge removing capacitor configured to be switched by at least one switch, includes: a power-on step of operating the actuator; a first touch sensing step of calculating touch data in all areas of the touch panel; a uniformity check step of calculating uniformity of the touch data; an electric charge removing capacitor setting step of setting the number of electric charge removing capacitors respectively connected to the plurality of touch electrodes on the basis of the uniformity of the touch data; a second touch sensing step of calculating the touch data in all the areas of the touch panel; and a touch coordinate calculating step of calculating a touch coordinate on the basis of the touch data calculated in the second touch sensing step.

Other detailed matters of the exemplary aspects are included in the detailed description and the drawings.

According to the present disclosure, the actuator may deform the display panel, thereby improving the ability to display the stereoscopic display of the display device.

According to the present disclosure, the touch performance may be improved in the non-stretched state of the touch panel and in the stretched state of the touch panel.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which:

FIG. 14 is a view illustrating a level of the touch data after the correction is performed on the touch panel of the display device according to the aspect of the present disclosure.

DETAILED DESCRIPTION

Figure 1:
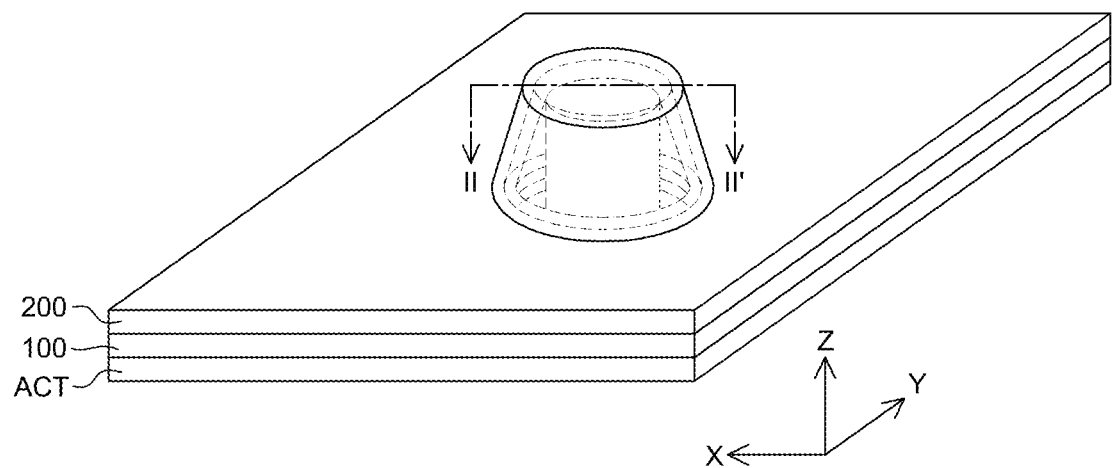
FIG. 1 is a perspective view of a display device according to an aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be displayed in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, a display device according to exemplary aspects of the present disclosure will be described in detail with reference to accompanying drawings.

Display Panel and Actuator

FIG. 1 is a perspective view of a display device according to an aspect of the present disclosure.

Figure 2A:
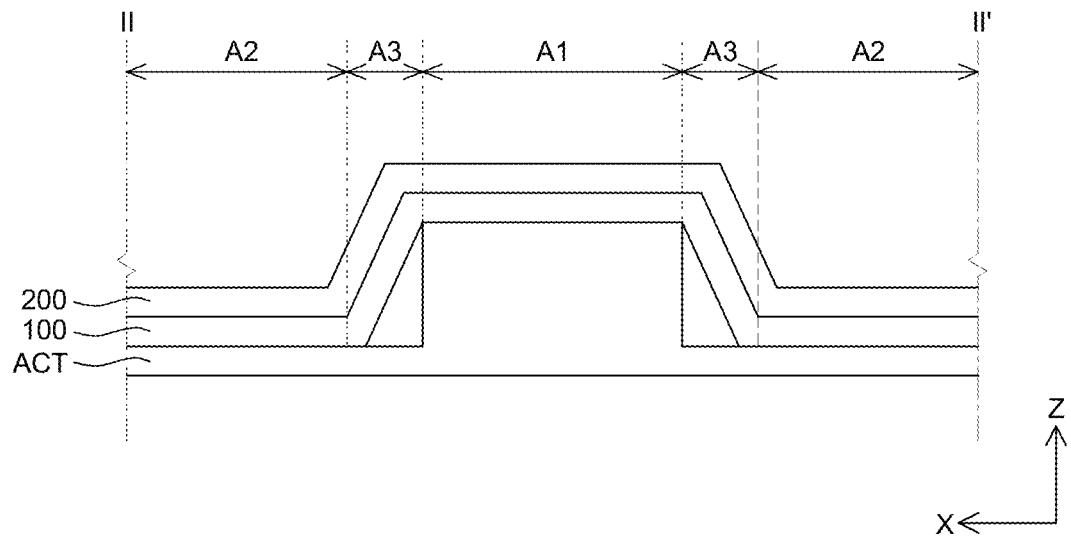
FIGS. 2A and 2B are cross-sectional views taken along cutting line II-II' illustrated in FIG. 1.
Figure 2B:
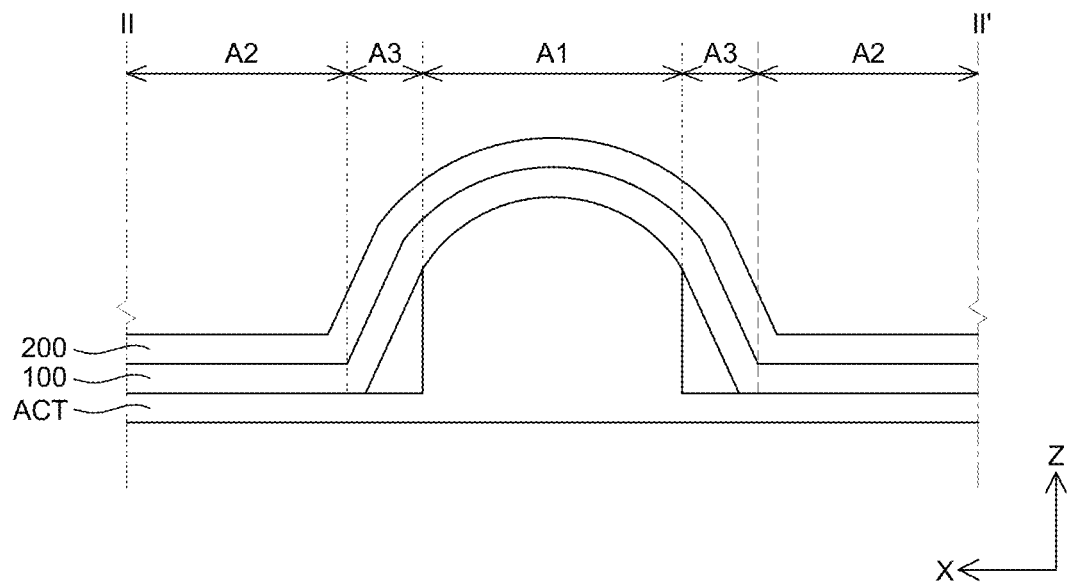

FIGS. 2A and 2B are cross-sectional views taken along cutting line II-II' illustrated in FIG. 1.

FIG. 2A illustrates that a contact portion between a display panel and a flat actuator, and FIG. 2B illustrates that the contact portion between the display panel and the spherical actuator.

A display device according to an aspect of the present disclosure includes an stretchable display panel 100, an stretchable touch panel 200, and an actuator ACT configured to deform a shape of the display panel 100 and a shape of the touch panel 200.

As illustrated in FIG. 1, the display panel 100 and the touch panel 200 may be sequentially stacked on the actuator ACT. The touch panel 200 is illustrated as an add-on type and separately manufactured from the display panel 100. However, the touch panel 200 may be disposed on a lower portion of the display panel 100 or may be integrated into the display panel 100.

The actuator ACT deforms the shape of the display panel 100 and the shape of the touch panel 200. Specifically, the actuator ACT may be configured such that a partial area of the actuator ACT protrudes in a direction of the display panel 100 and the touch panel 200 so that a partial area of the display panel 100 and a partial area of the touch panel 200 may be non-planar. For example, as illustrated in FIG. 1, the actuator ACT may be configured such that a partial area of the actuator ACT may protrude in a Z direction so that a partial area of the display panel 100 and a partial area of the touch panel 200, which correspond to the partial area of the actuator ACT, are deformed to protrude in a convex shape in the Z direction.

In this case, the actuator ACT may be configured as an electroactive polymer fiber (EAP), a piezoelectric element, a shape memory alloy (SMA), a thermal fluid pocket, a micro-electro-mechanical system (MEMS) element, a MEMS pump, or a resonance device. The electroactive polymer fiber may change in shape thereof in response to an applied voltage. The electroactive polymer fiber may be configured by using at least one of electrostrictive polymer (EP), dielectric elastomer (DE), conductive polymer, ionic polymer metal composite (IPMC), responsive gel, and bucky gel.

In addition, in case that an original shape is deformed, a shape memory alloy, which restores the original shape in accordance with an ambient temperature and/or ambient environment, may be configured include a copper-zinc-aluminum alloy, a copper-aluminum-nickel alloy, a nickel-titanium alloy, or a combination of a copper-zinc-aluminum alloy, a copper-aluminum-nickel alloy, and/or a nickel-titanium alloy.

In some aspects, the display panel 100 and the touch panel 200 may be stretched by the actuator ACT. Specifically, the display panel of the display device according to the aspect of the present disclosure may be a display device that may display images even though the display device is stretched, bent, or extended by the actuator ACT. The display panel may be referred to as a stretchable display panel, a flexible display panel, and an extendable display panel. Further, in case that the actuator ACT is restored to the previous flat state, the display panel may also be restored to the flat state.

As illustrated in FIGS. 2A and 2B, in case that the display panel 100 and the touch panel 200 are deformed by the actuator ACT, three areas may be defined when the display panel 100 and the touch panel 200 are deformed. For example, the display panel 100 and the touch panel 200 may each be divided into a first area A1 allowed to protrude by the actuator ACT, a second area A2 configured not to be allowed to protrude by the actuator ACT, and a third area A3 configured to connect the first area A1 and the second area A2.

In one aspect illustrated in FIG. 2A, the first area A1 may be in direct contact with a partial area of the actuator ACT protruding in a third direction Z, and the first area A1 may have a flat shape extending in a first direction X and a second direction Y. Further, the second area A2 may be in direct contact with other areas of the actuator ACT that do not protrude. The second area A2 may have a flat shape extending in the first direction X and the second direction Y.

Therefore, the first area A1 and the second area A2 may be disposed on different planes. Because the third area A3 is a bridge region that connects the first and second areas A1 and A2 disposed on different planes, the third area A3 may have a shape inclined with respect to the plane in the first and second directions X and Y. Further, because the third area A3 is not in direct contact with the actuator ACT, the third area A3 is not deformed directly by the actuator ACT. However, the third area A3 may be indirectly deformed by the first area A1 and the second area A2.

However, the present disclosure is not limited thereto. As illustrated in FIG. 2B, the first area A1 may be a spherical surface and be in direct contact with a partial area of the actuator ACT that protrudes in the third direction Z. Therefore, at a boundary between the first area A1 and the third area A3, the display panel 100 and the touch panel 200 may be deformed in a curved shape instead of an angular shape. Therefore, it is possible to reduce stress applied to the display panel 100 and the touch panel 200 at the boundary between the first area A1 and the third area A3.

Structure of Display Panel

Figure 3:
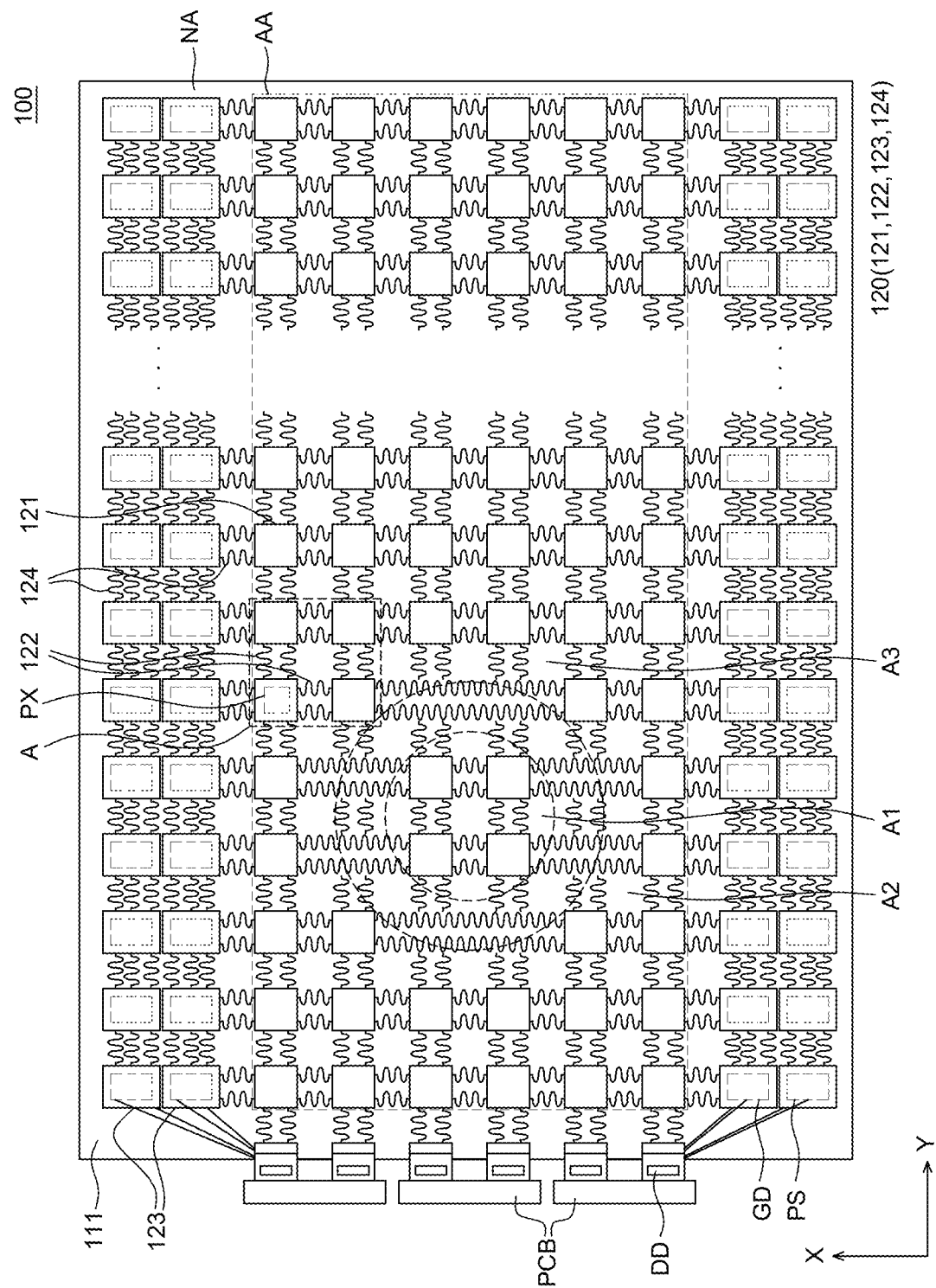
FIG. 3 is a top plan view of a display panel of the display device according to the aspect of the present disclosure.

FIG. 3 is a top plan view of the display panel of the display device according to the aspect of the present disclosure.

Figure 4:
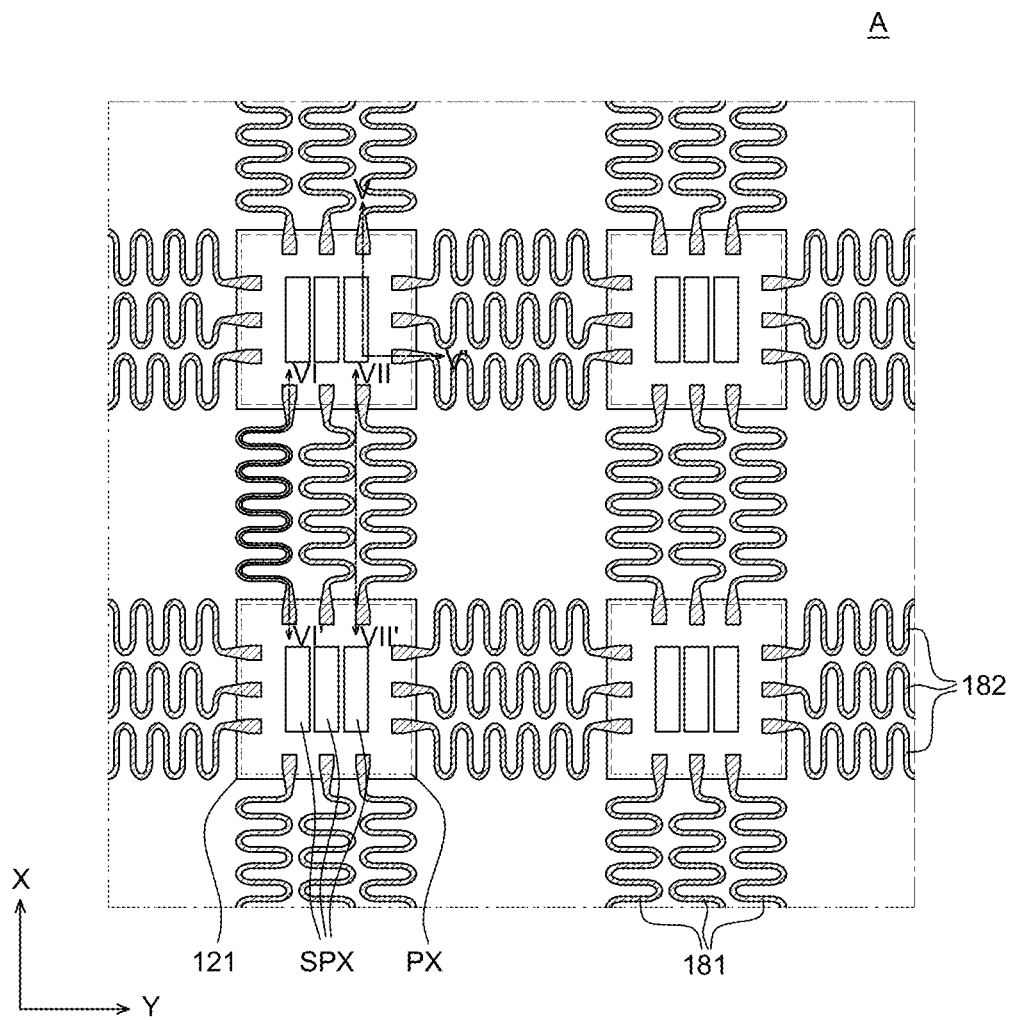
FIG. 4 is an enlarged top plan view of a display area of the display device according to the aspect of the present disclosure.

FIG. 4 is an enlarged top plan view of a display area of the display device according to the aspect of the present disclosure.

Figure 5:
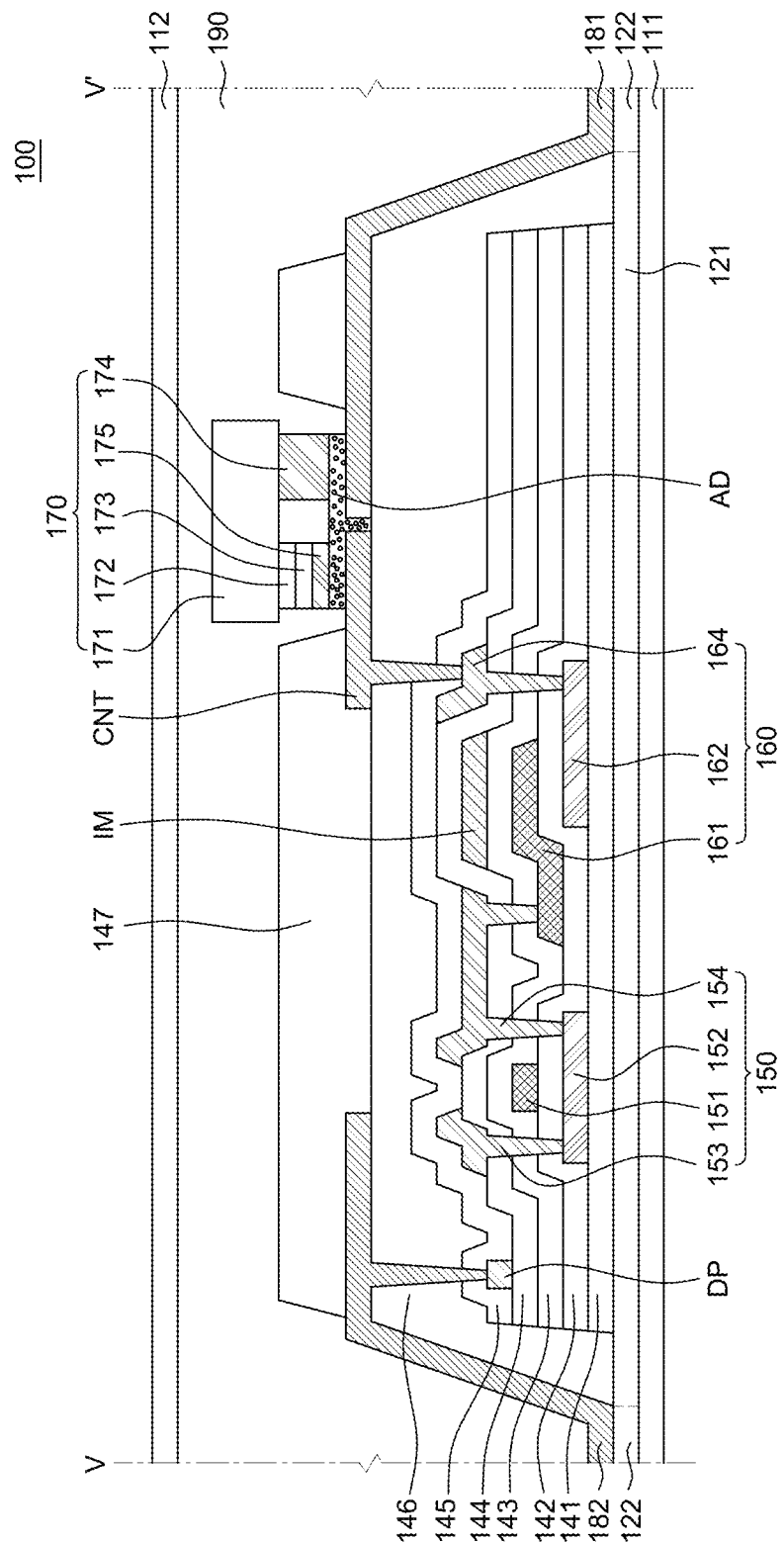
FIG. 5 is a cross-sectional view taken along cutting line V-V' in FIG. 4.

FIG. 5 is a cross-sectional view taken along cutting line V-V' in FIG. 4.

In some aspects, FIG. 4 is an enlarged top plan view of area A illustrated in FIG. 3.

With reference to FIG. 3, the display panel 100 of the display device according to the aspect of the present disclosure may include a lower substrate 111, a pattern layer 120, a plurality of pixels PX, a gate driver GD, a data driver DD, and a power supply PS. Further, with reference to FIG. 5, the display panel 100 of the display device according to the aspect of the present disclosure may further include a filling layer 190 and an upper substrate 112.

The lower substrate 111 is configured to support and protect several elements of the display panel 100 of the display device. The upper substrate 112 is configured to cover and protect several elements of the display panel 100 of the display device. That is, the lower substrate 111 is configured to support the pattern layer 120 on which the pixel PX, the gate driver GD, and the power supply PS are formed. Further, the upper substrate 112 is configured to cover the pixel PX, the gate driver GD, and the power supply PS.

The lower substrate 111 and the upper substrate 112 may comprise a flexible and insulating material that is bendable or stretchable. For example, the lower substrate 111 and the upper substrate 112 may each be made of silicone rubber such as polydimethylsiloxane (PDMS) or elastomer such as polyurethane (PU) and polytetrafluoroethylene (PTFE) and thus have flexibility. In some cases, the lower substrate 111 and the upper substrate 112 may be made of the same material. However, the present disclosure is not limited thereto. The lower substrate 111 and the upper substrate 112 may be variously modified and may be different materials.

The lower substrate 111 and the upper substrate 112 may each be a flexible substrate that may reversibly expand and contract. Therefore, the lower substrate 111 may also be referred to as a lower stretchable substrate, a lower contractible substrate, a lower extendable substrate, a lower flexible substrate, a lower ductile substrate, a first stretchable substrate, a first contractible substrate, a first extendable substrate, a first flexible substrate, or a first ductile substrate. The upper substrate 112 may also be referred to as an upper stretchable substrate, an upper contractible substrate, an upper extendable substrate, an upper flexible substrate, an upper ductile substrate, a second stretchable substrate, a second contractible substrate, a second extendable substrate, a second flexible substrate, or a second ductile substrate. In addition, the lower substrate 111 and the upper substrate 112 may each have an elastic modulus of several MPa to several hundreds of MPa. Further, a ductile breaking rate of each of the lower substrate 111 and the upper substrate 112 may be 100% or more. In this case, the ductile breaking rate corresponds to an elongation ratio at a time point at which a stretching object experiences physical failure such as the introduction breaks or cracks. A thickness of the lower substrate may be 10 m to 1 mm. However, the present disclosure is not limited thereto.

The lower substrate 111 may have a display area (active area AA), and a non-display area (non-active area NA) configured to surround the display area AA. However, the display area AA and the non-display area (non-active area NA) may be referred to for explaining the entire display panel without being referred to for explaining only the lower substrate 111.

The display area AA is an area of the display panel 100 of the display device in which images are displayed. The plurality of pixels PX is disposed in the display area AA. Further, the pixels PX may each include display elements, and various driving elements for operating the display elements. Various driving elements may include at least one thin-film transistor (TFT) and at least one capacitor. However, the present disclosure is not limited thereto. Further, the plurality of pixels PX may each be connected to various lines. For example, the plurality of pixels PX may each be connected to various lines such as gate lines, data lines, high-potential power lines, low-potential power lines, or reference voltage lines.

The non-display area NA is an area in which no image is displayed. The non-display area NA may be disposed adjacent to the display area AA. For example, the non-display area NA may be an area that surrounds the display area AA. However, the present disclosure is not limited thereto. In some aspects, the non-display area NA may be disposed on a portion of the lower substrate 111 that excludes the display area AA. The non-display area NA may be modified and divided into various shapes. Various components and materials for operating the plurality of pixels PX disposed in the display area AA may be disposed in the non-display area NA. For example, the gate driver GD and the power supply PS may be disposed in the non-display area NA. Further, a plurality of pads connected to the gate driver GD and the data driver DD may be disposed in the non-display area NA. The pads may be respectively connected to the plurality of pixels PX in the display area AA.

With reference to FIG. 3, the first area A1 may include the actuator ACT illustrated in FIGS. 1 and 2 and may be disposed in the display area AA. The second area A2 is not allowed to protrude by the actuator ACT and may be disposed over the display area AA and the non-display area NA. The third area A3 connects the first area A1 and the second area A2 is disposed in the display area AA. Further, as illustrated in FIG. 3, the plurality of pixels PX may be disposed only in the first area A1 and the second area A2, and the third area A3 is configured to not overlap any pixels PX of the stretchable display panel 100.

The pattern layer 120 is disposed on the lower substrate 111 and includes a plurality of first plate patterns 121 and a plurality of first line patterns 122 disposed in the display area AA, and a plurality of second plate patterns 123 and a plurality of second line patterns 124 disposed in the non-display area NA.

The plurality of first plate patterns 121 may be disposed in the display area AA of the lower substrate 111. The plurality of pixels PX may be formed on the plurality of first plate patterns 121 and may be disposed in the non-display area NA of the lower substrate 111. In some aspects, the gate driver GD and the power supply PS may be formed on the plurality of second plate patterns 123.

The plurality of first plate patterns 121 and the plurality of second plate patterns 123 may be disposed in island shapes separated from one another. The plurality of first plate patterns 121 and the plurality of second plate patterns 123 may be individually separated. Therefore, the plurality of first plate patterns 121 and the plurality of second plate patterns 123 may be referred to as first island patterns and second island patterns or first individual patterns and second individual patterns.

In some aspects, the gate driver GD may be mounted on the plurality of second plate patterns 123. The gate driver GD may be formed on the second plate pattern 123 in a gate-in-panel (GIP) manner when various constituent elements on the first plate pattern 121 are manufactured. Therefore, various circuit components, such as various transistors, capacitors, lines, and the like that constitute the gate driver GD, may be disposed on the plurality of second plate patterns 123. However, the present disclosure is not limited thereto. The gate driver GD may be mounted in a chip-on-film (COF) manner.

Further, the power supply PS may be mounted on the plurality of second plate patterns 123. The power supply PS may be formed on the second plate pattern 123 and provided as a plurality of power blocks patterned when various constituent elements on the first plate pattern 121 are manufactured. Therefore, the power blocks, which are disposed on different layers, may be disposed on the second plate pattern 123. That is, lower and upper power blocks may be sequentially disposed on the second plate pattern 123. Further, a low-potential voltage may be applied to the lower power block, and a high-potential voltage may be applied to the upper power block. In some aspects, the low-potential voltage may be supplied to the plurality of pixels PX through the lower power block. Further, the high-potential voltage may be supplied to the plurality of pixels PX through the upper power block.

In one aspect illustrated in FIG. 3, a size of each of the plurality of second plate patterns 123 may be larger than a size of each of the plurality of first plate patterns 121. For example, the gate driver GD may be disposed on each of the plurality of second plate patterns 123. One stage of the gate driver GD may be disposed on each of the plurality of second plate patterns 123. Therefore, an area occupied by various circuit components, which constitute one stage of the gate driver GD, is larger than an area occupied by the pixel PX, such that a size of each of the plurality of second plate patterns 123 may be larger than a size of each of the plurality of first plate patterns 121.

FIG. 3 illustrates that second plate patterns 123 are disposed at opposing sides based on the first direction X in the non-display area NA. However, the present disclosure is not limited thereto. The second plate patterns 123 may be disposed in any area in the non-display area NA. In addition, the first plate patterns 121 and the second plate patterns 123 are illustrated as each having a quadrangular shape. However, the present disclosure is not limited thereto. The first plate patterns 121 and the second plate patterns 123 may be modified to have various shapes and may be different from each other.

With reference to FIGS. 3 and 5, the pattern layer 120 may further include the plurality of first line patterns 122 disposed in the display area AA, and the plurality of second line patterns 124 disposed in the non-display area NA.

The first line patterns 122 are disposed in the display area AA and configured to connect adjacent first plate patterns 121. The first line patterns 122 may also be referred to as first connection patterns. That is, the first line patterns 122 are disposed between the first plate patterns 121.

The second line patterns 124 may be disposed in the non-display area NA and configured to connect the first plate patterns 121 and the second plate patterns 123, which are adjacent to one another, or connect adjacent second plate patterns 123 adjacent to one another. The second line patterns 124 may also be referred to as second connection patterns. That is, the second line patterns 124 may be disposed between adjacent first and second plate patterns 121 and 123. Further, the second line patterns 124 may be disposed between adjacent second plate patterns 123.

With reference to FIG. 3, the plurality of first line patterns 122 and the plurality of second line patterns 124 each have a curved shape. For example, the plurality of first line patterns 122 and the plurality of second line patterns 124 may each have a sinusoidal shape. However, the shapes of the plurality of first line patterns 122 and the shapes of the plurality of second line patterns 124 are not limited thereto. For example, the plurality of first line patterns 122 and the plurality of second line patterns 124 may each extend in a zigzag shape, or comprise multiple lines that cross each other. For example, the first line patterns 122 and the line patterns 124 may each have various shapes such as a plurality of rhombic substrates that are connected at vertices. The numbers and shapes of the first line patterns 122 and the second line patterns 124 illustrated in FIG. 3 are examples. The plurality of first line patterns 122 and the plurality of second line patterns 124 may be variously changed in numbers and shapes in accordance with design.

Further, the plurality of first plate patterns 121, the plurality of first line patterns 122, the plurality of second plate patterns 123, and the plurality of second line patterns 124 are each a rigid pattern. That is, the plurality of first plate patterns 121, the plurality of first line patterns 122, the plurality of second plate patterns 123, and the plurality of second line patterns 124 may be more rigid than the lower substrate 111 and the upper substrate 112. Therefore, the plurality of first plate patterns 121, the plurality of first line patterns 122, the plurality of second plate patterns 123, and the plurality of second line patterns 124 may each have an elastic modulus higher than an elastic modulus of the lower substrate 111. The elastic modulus (modulus of elasticity) refers to a parameter that indicates a ratio of the substrate deformed by stress applied to the substrate. Hardness may increase relatively as the elastic modulus increases relatively. Therefore, the plurality of first plate patterns 121, the plurality of first line patterns 122, the plurality of second plate patterns 123, and the plurality of second line patterns 124 may be respectively referred to as a plurality of first rigid patterns, a plurality of second rigid patterns, a plurality of third rigid patterns, and a plurality of fourth rigid patterns. The plurality of first plate patterns 121, the plurality of first line patterns 122, the plurality of second plate patterns 123, and the plurality of second line patterns 124 may each have an elastic modulus that may be 1000 times higher than the elastic modulus of the lower substrate 111 and the upper substrate 112. However, the present disclosure is not limited thereto.

The plurality of first plate patterns 121, the plurality of first line patterns 122, the plurality of second plate patterns 123, and the plurality of second line patterns 124, which may also be referred to as the plurality of rigid patterns, may each be made of a plastic material having lower flexibility than those of the lower substrate 111 and the upper substrate 112. For example, the plurality of first plate patterns 121, the plurality of first line patterns 122, the plurality of second plate patterns 123, and the plurality of second line patterns 124 may each be made of at least one of polyimide (PI), polyacrylate, and polyacetate. In this case, the plurality of first plate patterns 121, the plurality of first line patterns 122, the plurality of second plate patterns 123, and the plurality of second line patterns 124 may be made of the same material. However, the present disclosure is not limited thereto. The plurality of first plate patterns 121, the plurality of first line patterns 122, the plurality of second plate patterns 123, and the plurality of second line patterns 124 may be made of different materials. The plurality of first plate patterns 121, the plurality of first line patterns 122, the plurality of second plate patterns 123, and the plurality of second line patterns 124 may be integrated when the plurality of first plate patterns 121, the plurality of first line patterns 122, the plurality of second plate patterns 123, and the plurality of second line patterns 124 are made of the same material.

In some aspects, the lower substrate 111 may include a plurality of first lower patterns and a second lower pattern. The plurality of first lower patterns may overlap the plurality of first plate patterns 121 and the plurality of second plate patterns 123 of the lower substrate 111. The second lower pattern may not overlap the plurality of first plate patterns 121 and the plurality of second plate patterns 123.

In addition, the upper substrate 112 may include a plurality of first upper patterns and a second upper pattern. The plurality of first upper patterns may overlap the plurality of first plate patterns 121 and the plurality of second plate patterns 123 of the upper substrate 112. The second upper pattern may not overlap the plurality of first plate patterns 121 and the plurality of second plate patterns 123.

In this case, the plurality of first lower patterns and the plurality of first upper patterns may each have an elastic modulus higher than an elastic modulus of each of the second lower pattern and the second upper pattern. For example, the plurality of first lower patterns and the plurality of first upper patterns may each be made of the same material as the plurality of first plate patterns 121 and the plurality of second plate patterns 123. The second lower pattern and the second upper pattern may each be made of a material having a lower elastic modulus than those of the plurality of first plate patterns 121 and the plurality of second plate patterns 123.

Non-limiting examples of the first lower pattern and the first upper pattern includes polyimide (PI), polyacrylate, polyacetate, or the like. Non-limiting examples of the second lower pattern and the second upper pattern include silicone rubber such as polydimethylsiloxane (PDMS) or elastomer such as polyurethane (PU) or polytetrafluoroethylene (PTFE).

Driving Element in Non-Display Area

The gate driver GD is configured to supply gate voltages to the plurality of pixels PX disposed in the display area AA. The gate driver GD includes a plurality of stages formed on the plurality of second plate patterns 123. The stages of the gate driver GD may be electrically connected to one another through a plurality of gate connection lines. In this case, a gate voltage outputted from any one stage may be transmitted to another stage. Further, the stages may sequentially supply the gate voltages to the plurality of pixels PX respectively connected to the stages.

The power supply PS may be connected to the gate driver GD and supply a gate drive voltage and a gate clock voltage. Further, the power supply PS may be connected to the plurality of pixels PX and supply pixel drive voltages to the plurality of pixels PX. In addition, the power supply PS may be formed on the plurality of second plate patterns 123. That is, the power supply PS may be formed on the second plate pattern 123 to be adjacent to the gate driver GD. Further, the power supplies PS formed on the plurality of second plate patterns 123 may be electrically connected to the gate driver GD and the plurality of pixels PX. That is, the plurality of power supplies PS formed on the plurality of second plate patterns 123 may be connected by gate power connection lines and pixel power connection lines. The plurality of power supplies PS may each supply the gate drive voltage, the gate clock voltage, and the pixel drive voltage.

A printed circuit board PCB refers to a component that transmits signals and voltages for operating the display elements to the display elements from a controller. In some aspects, the printed circuit board PCB may be referred to as a drive substrate. Integrated circuits (ICs) such as a controller and other circuit parts (e.g., capacitors, resistors) may be mounted on the printed circuit board PCB. In addition, memories, processors, and the like may be mounted on the printed circuit board PCB. Further, the printed circuit board PCB provided in the display panel 100 of the display device may include a stretchable area and a non-stretchable area to ensure stretchability. Further, IC chips, circuit parts, memories, processors, and the like may be mounted in the non-stretchable area. Lines electrically connected to the IC chips, the circuit parts, the memories, and the processors may be disposed in the stretchable area.

The data driver DD is configured to supply data voltages to the plurality of pixels PX disposed in the display area AA. The data driver DD may be configured in the form of a single IC chip and referred to as a data integrated circuit (D-IC). Further, the data driver DD may be mounted in the non-stretchable area of the printed circuit board PCB. That is, the data driver DD may be mounted on the printed circuit board PCB in a chip-on-board (COB) manner. FIG. 3 illustrates that the data driver DD is mounted in a chip-on-board (COB) manner. However, the present disclosure is not limited thereto. For example, the data driver DD may be mounted in a chip-on-film (COF) manner, a chip-on-glass (COG) manner, a tape carrier package (TCP) manner, and the like.

In addition, FIG. 3 illustrates that a single data driver DD is disposed to correspond to one row of first plate patterns 121 disposed in the display area AA. However, the present disclosure is not limited thereto. That is, the single data driver DD may be disposed to correspond to a plurality of rows of first plate patterns 121.

Hereinafter, the display area AA of the display panel 100 of the display device according to the aspect of the present disclosure will be described in more detail with reference to FIGS. 6 and 7.

Planar and Cross-Sectional Structures of Display Area

Figure 6:
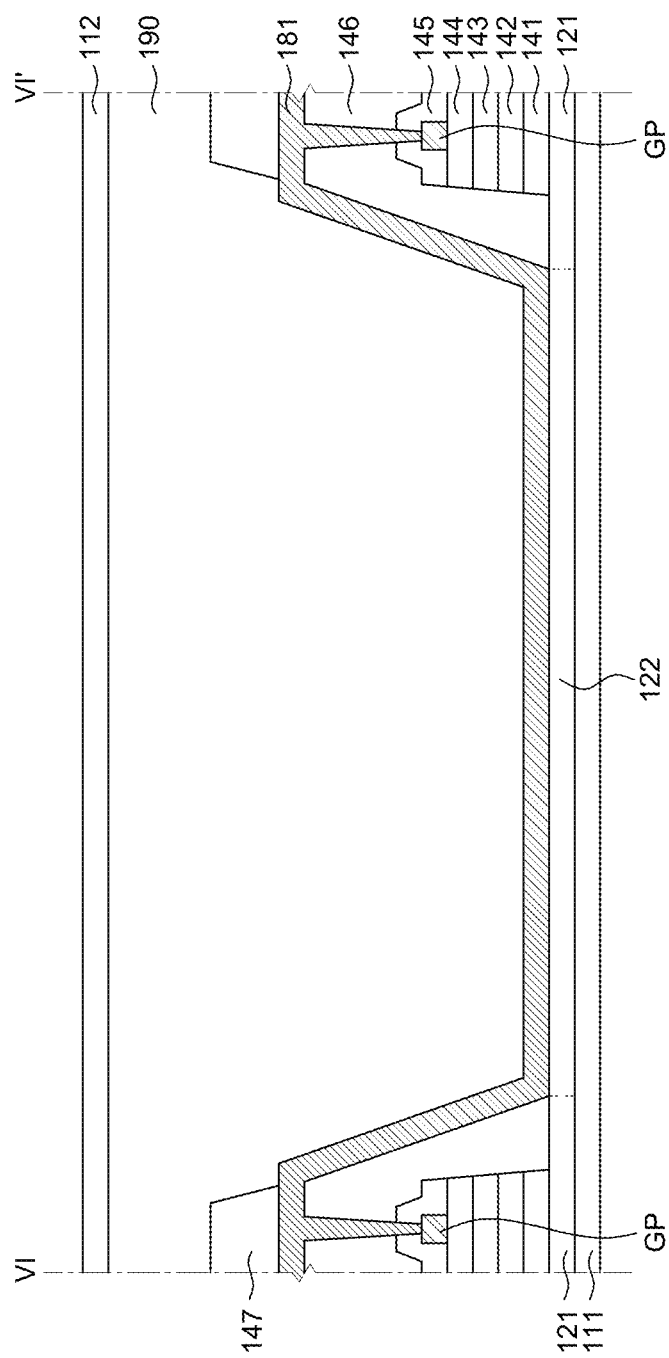
FIG. 6 is a cross-sectional view taken along cutting line VI-VI' in FIG. 4.

FIG. 6 is a cross-sectional view taken along cutting line VI-VI' in FIG. 4.

Figure 7:
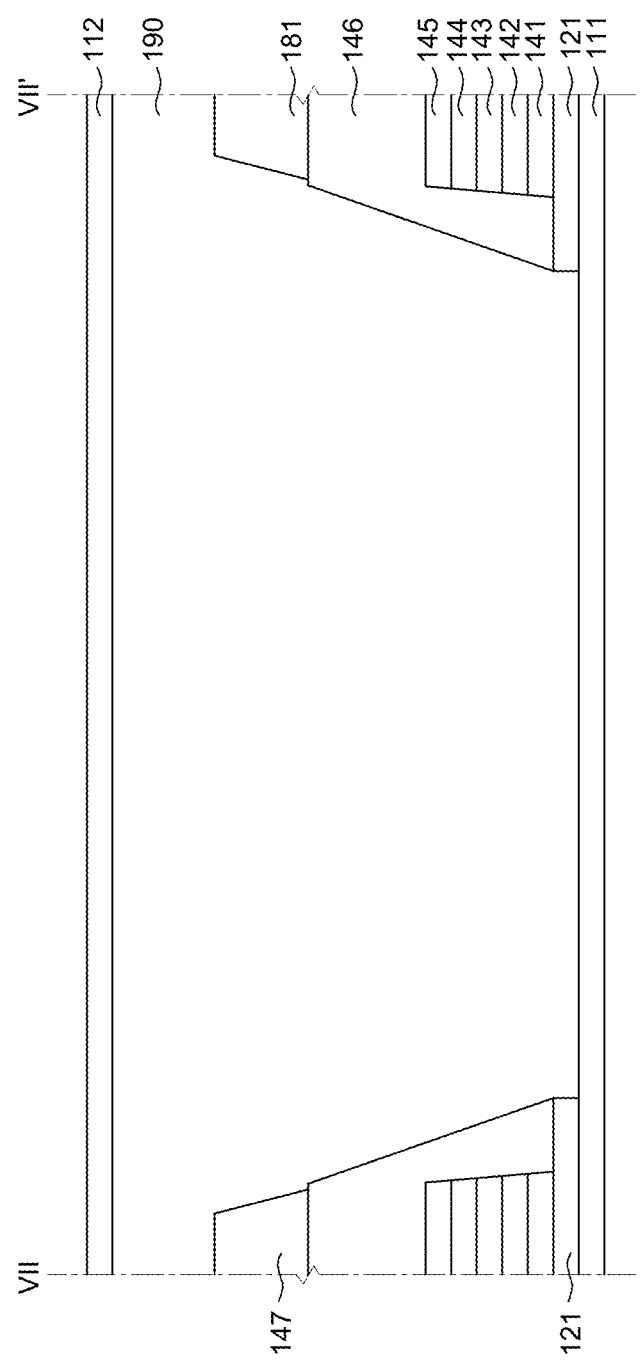
FIG. 7 is a cross-sectional view taken along cutting line VII-VII' in FIG. 4.

FIG. 7 is a cross-sectional view taken along cutting line VII-VII' in FIG. 4.

For convenience of description, the description will be made with reference to FIGS. 3 to 5.

With reference to FIGS. 3 and 4, the plurality of first plate patterns 121 is disposed on the lower substrate 111 in the display area AA. The plurality of first plate patterns 121 is disposed on the lower substrate 111 and separated from one another. For example, as illustrated in FIG. 3, the plurality of first plate patterns 121 may be disposed in a matrix shape on the lower substrate 111. However, the present disclosure is not limited thereto.

With reference to FIGS. 4 and 5, the pixel PX includes a plurality of subpixels SPX disposed on the first plate pattern 121. Further, the subpixels SPX may each include a light emitting diode (LED) 170, which is a display element, a driving transistor 160, and a switching transistor 150 for operating the LED 170. However, in the subpixel SPX, the display element is not limited to the LED and may be an organic light-emitting diode, or other light emitting structure. In some cases, the plurality of subpixels SPX may include a red subpixel, a green subpixel, and a blue subpixel. However, the present disclosure is not limited thereto. The colors of the plurality of subpixels SPX may be variously changed, as necessary.

The plurality of subpixels SPX may be connected to the plurality of connection lines 181 and 182. That is, the plurality of subpixels SPX may be electrically connected to a first connection line 181 extending in the first direction X. Further, the plurality of subpixels SPX may be electrically connected to a second connection line 182 extending in the second direction Y.

Hereinafter, a cross-sectional structure of the display area AA will be specifically described with reference to FIG. 5.

With reference to FIG. 5, a plurality of inorganic insulation layers is disposed on the plurality of first plate patterns 121. For example, the plurality of inorganic insulation layers may include a buffer layer 141, a gate insulation layer 142, a first interlayer insulation layer 143, a second interlayer insulation layer 144, and a passivation layer 145. However, the present disclosure is not limited thereto. Various inorganic insulation layers may be additionally disposed on the plurality of first plate patterns 121. Alternatively, one or more of the buffer layer 141, the gate insulation layer 142, the first interlayer insulation layer 143, the second interlayer insulation layer 144, and the passivation layer 145, which are inorganic insulation layers, may be excluded.

In some aspects, the buffer layer 141 is disposed on the plurality of first plate patterns 121. The buffer layer 141 is formed on the plurality of first plate patterns 121 to protect various components of the display panel 100 of the display device from penetration of moisture ($H_2O$) and oxygen ($O_2$) from the outside of the lower substrate 111 and the plurality of first plate patterns 121. The buffer layer 141 may be made of an insulating material. For example, the buffer layer 141 may be configured as a single layer or multilayer made of at least one of silicon nitride (SiNx), silicon oxide (SiOx), and silicon oxynitride (SiON). However, the buffer layer 141 may be excluded in accordance with the structure or properties of the display panel 100 of the display device.

In this case, the buffer layer 141 may be formed only in an area in which the lower substrate 111 overlaps the plurality of first plate patterns 121 and the plurality of second plate patterns 123. As described above, because the buffer layer 141 may be made of an inorganic material, the display panel 100 of the display device may easily damage or crack while stretching the display panel 100 of the display device. Therefore, the buffer layer 141 may be formed only on upper portions of the plurality of first plate patterns 121 and upper portions of the plurality of second plate patterns 123 by being patterned in shapes of the plurality of first plate patterns 121 and shapes of the plurality of second plate patterns 123 without being formed in areas between the plurality of first plate patterns 121 and the plurality of second plate patterns 123. Therefore, in the display panel 100 of the display device according to the aspect of the present disclosure, the buffer layer 141 is formed only in the area that overlaps the plurality of first plate patterns 121 and the plurality of second plate patterns 123 that are rigid patterns. Therefore, it is possible to suppress damage to various components of the display panel 100 of the display device when the display panel 100 is deformed by being curved or stretched.

With reference to FIG. 5, the switching transistor 150 comprises a gate electrode 151, an active layer 152, a source electrode 153, and a drain electrode 154 that are formed on the buffer layer 141. The driving transistor 160 comprises a gate electrode 161, an active layer 162, a source electrode, and a drain electrode 164 that are formed on the buffer layer 141.

First, with reference to FIG. 5, the active layer 152 of the switching transistor 150 and the active layer 162 of the driving transistor 160 are disposed on the buffer layer 141. For example, the active layer 152 of the switching transistor 150 and the active layer 162 of the driving transistor 160 may each be made of an oxide semiconductor. Alternatively, the active layer 152 of the switching transistor 150 and the active layer 162 of the driving transistor 160 may each be made of amorphous silicon (a-Si), polycrystalline silicon (poly-Si), an organic semiconductor, or the like.

The gate insulation layer 142 is disposed on the active layer 152 of the switching transistor 150 and the active layer 162 of the driving transistor 160. The gate insulation layer 142 electrically insulates the gate electrode 151 of the switching transistor 150 and the active layer 152 of the switching transistor 150 and electrically insulates the gate electrode 161 of the driving transistor 160 and the active layer 162 of the driving transistor 160. In some cases, the gate insulation layer 142 may be made of an insulating material. For example, the gate insulation layer 142 may be configured as a single layer made of silicon nitride (SiNx) or silicon oxide (SiOx) that is an inorganic material. Alternatively, the gate insulation layer 142 may be configured as a multilayer made of silicon nitride (SiNx) or silicon oxide (SiOx). However, the present disclosure is not limited thereto.

The gate electrode 151 of the switching transistor 150 and the gate electrode 161 of the driving transistor 160 are disposed on the gate insulation layer 142. The gate electrode 151 of the switching transistor 150 and the gate electrode 161 of the driving transistor 160 are disposed on the gate insulation layer 142 and separated from each other. Further, the gate electrode 151 of the switching transistor 150 overlaps the active layer 152 of the switching transistor 150. The gate electrode 161 of the driving transistor 160 overlaps the active layer 162 of the driving transistor 160.

The gate electrode 151 of the switching transistor 150 and the gate electrode 161 of the driving transistor 160 may each be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the gate electrode 151 of the switching transistor 150 and the gate electrode 161 of the driving transistor 160 may each be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

The first interlayer insulation layer 143 is disposed on the gate electrode 151 of the switching transistor 150 and the gate electrode 161 of the driving transistor 160. The first interlayer insulation layer 143 insulates the gate electrode 161 of the driving transistor 160 and an intermediate metal layer IM. The first interlayer insulation layer 143 may be made of an inorganic material. For example, the first interlayer insulation layer 143 may be configured as a single layer made of silicon nitride (SiNx) or silicon oxide (SiOx) that is an inorganic material. Alternatively, the first interlayer insulation layer 143 may be configured as a multilayer made of silicon nitride (SiNx) or silicon oxide (SiOx). However, the present disclosure is not limited thereto.

The intermediate metal layer IM is disposed on the first interlayer insulation layer 143. Further, the intermediate metal layer IM overlaps the gate electrode 161 of the driving transistor 160. Therefore, a storage capacitor is formed in an area in which the intermediate metal layer IM and the gate electrode 161 of the driving transistor 160 overlap each other. Specifically, the storage capacitor is formed by the gate electrode 161 of the driving transistor 160, the first interlayer insulation layer 143, and the intermediate metal layer IM. However, the arrangement area of the intermediate metal layer IM is not limited thereto. Various storage capacitors may be formed as the intermediate metal layer IM overlaps other electrodes.

The intermediate metal layer IM may be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the intermediate metal layer IM may be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

The second interlayer insulation layer 144 is disposed on the intermediate metal layer IM. The second interlayer insulation layer 144 insulates the gate electrode 151 of the switching transistor 150 and the source electrode 153 and the drain electrode 154 of the switching transistor 150. Further, the second interlayer insulation layer 144 insulates the intermediate metal layer IM and the source electrode and the drain electrode 164 of the driving transistor 160. The second interlayer insulation layer 144 may be made of an inorganic material. For example, the first interlayer insulation layer 143 may be configured as a single layer made of silicon nitride (SiNx) or silicon oxide (SiOx) that is an inorganic material. Alternatively, the first interlayer insulation layer 143 may be configured as a multilayer made of silicon nitride (SiNx) or silicon oxide (SiOx). However, the present disclosure is not limited thereto.

The source electrode 153 and the drain electrode 154 of the switching transistor 150 are disposed on the second interlayer insulation layer 144. Further, the source electrode and the drain electrode 164 of the driving transistor 160 are disposed on the second interlayer insulation layer 144. The source electrode 153 and the drain electrode 154 of the switching transistor 150 are disposed on the same layer and separated from each other. Further, the source electrode of the driving transistor 160 is not illustrated in FIG. 5. However, the source electrode of the driving transistor 160 is also disposed on the same layer as the drain electrode 164 and separated from the drain electrode 164. The source electrode 153 and the drain electrode 154 of the switching transistor 150 may be electrically connected to the active layer 152 while adjoining the active layer 152. Further, the source electrode and the drain electrode 164 of the driving transistor 160 may be electrically connected to the active layer 162 while adjoining the active layer 162. Further, the drain electrode 154 of the switching transistor 150 may be electrically connected to the gate electrode 161 of the driving transistor 160 while adjoining the gate electrode 161 of the driving transistor 160 through a contact hole.

The source electrode 153 and the drain electrodes 154 and 164 may each comprise various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the source electrode 153 and the drain electrodes 154 and 164 may each be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

In addition, the driving transistor 160 is described as having a coplanar structure. However, various transistors including a staggered structure may also be used. Further, in the present specification, the transistor may have a top gate structure and a bottom gate structure.

A gate pad GP and a data pad DP may be disposed on the second interlayer insulation layer 144.

Specifically, with reference to FIG. 6, the gate pad GP is a pad configured to transmit the gate voltages to the plurality of subpixels SPX. The gate pad GP is connected to the first connection line 181 through a contact hole. Further, the gate voltage supplied from the first connection line 181 may be transmitted from the gate pad GP to the gate electrode 151 of the switching transistor 150 through a line formed on the first plate pattern 121.

The data pad DP is configured to transmit the data voltages to the plurality of subpixels SPX. The data pad DP is connected to the second connection line 182 through a contact hole. Further, the data voltage supplied from the second connection line 182 may be transmitted from the data pad DP to the source electrode 153 of the switching transistor 150 through a line formed on the first plate pattern 121.

The gate pad GP and the data pad DP may be made of the same material as the source electrode 153 and the drain electrodes 154 and 164. However, the present disclosure is not limited thereto.

With reference to FIG. 5, the passivation layer 145 is formed on the switching transistor 150 and the driving transistor 160 to cover and protect the switching transistor 150 and the driving transistor 160 from the penetration of moisture and oxygen. The passivation layer 145 may be made of an inorganic material and configured as a single layer or multilayer. However, the present disclosure is not limited thereto.

Further, the gate insulation layer 142, the first interlayer insulation layer 143, the second interlayer insulation layer 144, and the passivation layer 145 may be patterned and formed in an area that overlaps the plurality of first plate patterns 121. Similar to the buffer layer 141, the gate insulation layer 142, the first interlayer insulation layer 143, the second interlayer insulation layer 144, and the passivation layer 145 may each also be made of an inorganic material. For this reason, the display panel 100 of the display device may be easily crack and become damaged while stretching the display panel 100 of the display device. Therefore, the gate insulation layer 142, the first interlayer insulation layer 143, the second interlayer insulation layer 144, and the passivation layer 145 may be formed only on the upper portions of the plurality of first plate patterns 121 by being patterned in the shapes of the plurality of first plate patterns 121 without being formed in the area between the plurality of first plate patterns 121.

A planarization layer 146 is formed on the passivation layer 145. The planarization layer 146 planarizes an upper portion of the switching transistor 150 and an upper portion of the driving transistor 160. The planarization layer 146 may be configured as a single layer or a plurality of layers and made of an organic material. Therefore, the planarization layer 146 may be referred to as an organic insulation layer. For example, the planarization layer 146 may be made of an acrylic-based organic material. However, the present disclosure is not limited thereto.

With reference to FIG. 5, the planarization layer 146 may be disposed on the plurality of first plate patterns 121 and cover top surfaces and side surfaces of the buffer layer 141, the gate insulation layer 142, the first interlayer insulation layer 143, the second interlayer insulation layer 144, and the passivation layer 145. Further, the planarization layer 146, together with the plurality of first plate patterns 121, surrounds the buffer layer 141, the gate insulation layer 142, the first interlayer insulation layer 143, the second interlayer insulation layer 144, and the passivation layer 145. For example, the planarization layer 146 may be disposed to partially cover a top surface and side surface of the passivation layer 145, a side surface of the first interlayer insulation layer 143, a side surface of the second interlayer insulation layer 144, a side surface of the gate insulation layer 142, a side surface of the buffer layer 141, and top surfaces of the plurality of first plate patterns 121. In some cases, the planarization layer 146 may compensate for level differences between the side surfaces of the buffer layer 141, the gate insulation layer 142, the first interlayer insulation layer 143, the second interlayer insulation layer 144, and the passivation layer 145. Further, the planarization layer 146 may increase bonding strength with the connection lines 181 and 182 that are disposed on the side surface of the planarization layer 146.

With reference to FIG. 5, an inclination angle of the side surface of the planarization layer 146 may be smaller than inclination angles defined between the side surfaces of the buffer layer 141, the gate insulation layer 142, the first interlayer insulation layer 143, the second interlayer insulation layer 144, and the passivation layer 145. For example, the side surface of the planarization layer 146 may have an inclination more gradual than inclinations defined by the side surface of the passivation layer 145, the side surface of the first interlayer insulation layer 143, the side surface of the second interlayer insulation layer 144, the side surface of the gate insulation layer 142, and the side surface of the buffer layer 141. Therefore, the connection lines 181 and 182 disposed to adjoin the side surface of the planarization layer 146 are disposed to have a gradual inclination to reduce stress applied to the connection lines 181 and 182 while the display panel 100 of the display device is stretched. Further, the side surface of the planarization layer 146 may have a relatively gradual inclination, thereby inhibiting the connection lines 181 and 182 from cracking or separating from the side surface of the planarization layer 146.

With reference to FIGS. 4 to 6, the connection lines 181 and 182 are lines that electrically connect the pads on the plurality of first plate patterns 121. The connection lines 181 and 182 are disposed on the plurality of first line patterns 122. Further, the connection lines 181 and 182 may also extend on the plurality of first plate patterns 121 to be electrically connected to the gate pad GP and the data pad DP on the plurality of first plate patterns 121. Further, with reference to FIG. 7, the first line pattern 122 is not disposed in the area in which the connection lines 181 and 182 are not disposed, among the areas between the plurality of first plate patterns 121.

The connection lines 181 and the connection lines 182 are disposed between the plurality of first plate patterns 121. Specifically, the connection lines 181 extend in the X axial direction between the plurality of first plate patterns 121. The connection lines 182 extend in the Y axial direction between the plurality of first plate patterns 121.

The connection lines 181 and 182 may each be configured as a layered structure made of a metallic material such as copper (Cu), aluminum (Al), titanium (Ti), or molybdenum (Mo) or a metallic material such as copper/molybdenum-titanium (Cu/MoTi) or titanium/aluminum/titanium (Ti/Al/Ti). However, the present disclosure is not limited thereto.

In the case of a general display panel of a display device, various lines such as a plurality of gate lines and a plurality of data lines are disposed between a plurality of subpixels and extend in straight shapes. The plurality of subpixels are connected to the single signal line. Therefore, in the case of the general display panel of the display device, various lines such as the gate line, the data line, the high-potential power line, and the reference voltage line extend in a direction from one side to the other side of the display panel of the organic light-emitting display device without interruption on the substrate.

In contrast, in the case of the display panel 100 of the display device according to the aspect of the present disclosure, various lines such as gate lines, data lines, high-potential power lines, and reference voltage lines, which are straight lines that may be considered as being used for the general display panel of the display device, are disposed only on the plurality of first plate patterns 121 and the plurality of second plate patterns 123. That is, in the display panel 100 of the display device according to the aspect of the present disclosure, straight lines are disposed only on the plurality of first plate patterns 121 and the plurality of second plate patterns 123.

In the display panel 100 of the display device according to the aspect of the present disclosure, the pads on the two adjacent first plate patterns 121 may be connected by the connection lines 181 and 182. Therefore, the connection lines 181 and 182 electrically connect the gate pads GP or the data pads DP on the two adjacent first plate patterns 121. Therefore, the display panel 100 of the display device according to the aspect of the present disclosure may include the plurality of connection lines 181 and 182 to electrically connect various lines such as the gate lines, the data lines, the high-potential power lines, and the reference voltage lines between the plurality of first plate patterns 121. For example, the gate line on the plurality of first plate patterns 121 may be disposed adjacent to one another in the first direction X, and the gate pads GP may be disposed at two opposite ends of the gate line. In this case, the plurality of gate pads GP on the plurality of first plate patterns 121 disposed adjacent to one another in the first direction X may be connected to one another by the first connection line 181 that serves as a gate line. Therefore, the gate line, which is disposed on the plurality of first plate patterns 121, and the first connection line 181, which is disposed on the line pattern 122, may serve as a single gate line. In addition, among all the various lines that may be included in the display panel 100 of the display device, the line extending in the first direction X, for example, the light-emitting signal line, the low-potential power line, and the high-potential power line may also be electrically connected by the first connection line 181, as described above.

With reference to FIGS. 4 and 6, the first connection line 181 may connect the gate pads GP on the two first plate patterns 121 disposed side by side, among the gate pads GP on the plurality of first plate patterns 121 disposed adjacent to one another in the first direction X. The first connection line 181 may serve as the gate line, the light-emitting signal line, the high-potential power line, or the low-potential power line. However, the present disclosure is not limited thereto. The gate pads GP on the plurality of first plate patterns 121 disposed in the first direction X may be connected by the first connection line 181 that serves as the gate line, such that the single gate voltage may be transmitted.

Further, with reference to FIGS. 4 and 5, the second connection line 182 may connect the data pads DP on the two first plate patterns 121 disposed side by side, among the data pads DP on the plurality of first plate patterns 121 disposed adjacent to one another in the second direction Y. The second connection line 182 may serve as the data line, the high-potential power line, the low-potential power line, or the reference voltage line. However, the present disclosure is not limited thereto. Internal lines on the plurality of first plate patterns 121 disposed in the second direction Y may be connected by the plurality of second connection lines 182 that serves as the data lines, such that the single data voltage may be transmitted.

As illustrated in FIG. 6, the first connection line 181 may be disposed to adjoin the top surface and the side surface of the planarization layer 146 disposed on the first plate pattern 121. Further, the first connection line 181 may extend to the top surface of the first line pattern 122. The second connection line 182 may also be disposed to adjoin the top surface and the side surface of the planarization layer 146 disposed on the first plate pattern 121. Further, the second connection line 182 may extend to the top surface of the first line pattern 122.

However, as illustrated in FIG. 7, because a rigid pattern need not be disposed in the area in which the first connection line 181 and the second connection line 182 are not disposed, the first line pattern 122, which is a rigid pattern, is not disposed on a lower portion of the first connection line 181 and a lower portion of the second connection line 182.

Meanwhile, with reference to FIG. 5, a bank 147 is formed on a connection pad CNT, the connection lines 181 and 182, and the planarization layer 146. The bank 147 separates the adjacent subpixels SPX. The bank 147 is disposed to at least partially cover a pad PD, the connection lines 181 and 182, and the planarization layer 146. The bank 147 may be made of an insulating material. In addition, the bank 147 may include a black material. When the bank 147 includes a black material, the bank 147 covers the lines that may be visually recognized through the display area AA. For example, the bank 147 may be made of a transparent carbon-based mixture. Specifically, the bank 147 may include carbon black. However, the present disclosure is not limited thereto. The bank 147 may be made of a transparent insulating material. Further, FIG. 5 illustrates that a height of the bank 147 is lower than a height of the LED 170. However, the present disclosure is not limited thereto. The height of the bank 147 may be equal to the height of the LED 170.

With reference to FIG. 5, the LED 170 is disposed on the connection pad CNT and the first connection line 181. The LED 170 includes an n-type layer 171, an active layer 172, a p-type layer 173, an n-electrode 174, and a p-electrode 175. The LED 170 of the display panel 100 of the display device according to the aspect of the present disclosure may have a flip chip structure having the n-electrode 174 and the p-electrode 175 formed on one surface thereof.

The n-type layer 171 may be formed by injecting n-type impurities into gallium nitride (GaN), which is a material having excellent crystallinity. The n-type layer 171 may also be disposed on a separate base substrate made of a material capable of emitting light.

The active layer 172 is disposed on the n-type layer 171. The active layer 172 may be a light-emitting layer provided in the LED 170 and configured to emit light. The active layer 172 may be made of a nitride semiconductor, e.g., indium gallium nitride (InGaN). The p-type layer 173 is disposed on the active layer 172. The p-type layer 173 may be formed by injecting p-type impurities into gallium nitride (GaN).

As described above, the LED 170 according to the aspect of the present disclosure is manufactured by sequentially stacking the n-type layer 171, the active layer 172, and the p-type layer 173, etching a predetermined portion, and then forming the n-electrode 174 and the p-electrode 175. In this case, the predetermined portion provides space to separate the n-electrode 174 and the p-electrode 175. The predetermined portion may be etched so that a part of the n-type layer 171 is exposed. In other words, a surface of the LED 170, on which the n-electrode 174 and the p-electrode 175 are to be disposed, may be a surface having different height levels instead of a planarized surface.

The n-electrode 174 may be disposed in the area etched as described above. The n-electrode 174 may be made of an electrically conductive material. Further, the p-electrode 175 may be disposed in a non-etched area. The p-electrode 175 may also be made of an electrically conductive material. For example, the n-electrode 174 is disposed on the n-type layer 171 exposed by the etching process, and the p-electrode 175 is disposed on the p-type layer 173. The p-electrode 175 may be made of the same material as the n-electrode 174.

A bonding layer AD may be disposed on a top surface of the connection pad CNT and a top surface of the first connection line 181 and disposed between the connection pad CNT and the first connection line 181, such that the LED 170 may be bonded onto the connection pad CNT and the first connection line 181. In this case, the n-electrode 174 may be disposed on the first connection line 181, and the p-electrode 175 may be disposed on the connection pad CNT.

The bonding layer AD may be a conductive bonding layer made by dispersing conductive balls into an insulating base member. Therefore, when heat or pressure is applied to the bonding layer AD, the conductive balls are electrically connected in a portion to which heat or pressure is applied and has conductive properties. An area of the bonding layer AD that is not pressed or heated may have insulation properties. For example, the n-electrode 174 is electrically connected to the first connection line 181 through the bonding layer AD, and the p-electrode 175 is electrically connected to the connection pad CNT through the bonding layer AD. The connection pad CNT, the p-electrode 175, the first connection line 181, and the n-electrode 174 may be electrically connected by applying the bonding layer AD onto the top surface of the first connection line 181 and the connection pad CNT in an inkjet manner or the like, transferring the LED 170 onto the bonding layer AD, and pressing and heating the LED 170. However, the other portions of the bonding layer AD, except for a portion of the bonding layer AD disposed between the n-electrode 174 and the first connection line 181 and a portion of the bonding layer AD disposed between the p-electrode 175 and the connection pad CNT, have insulation properties. Meanwhile, the bonding layers AD, which are provided as separated layers, may be respectively disposed on the connection pad CNT and the first connection line 181.

Further, the connection pad CNT is electrically connected to the drain electrode 164 of the driving transistor 160 and receives the drive voltage from the driving transistor 160, which is used to operate the LED 170. Further, a low-potential drive voltage for operating the LED 170 is applied to the first connection line 181. When the display panel 100 of the display device is turned on, the voltages with different levels, which are respectively applied to the connection pad CNT and the first connection line 181, are respectively transmitted to the n-electrode 174 and the p-electrode 175, such that the LED 170 emits light.

The upper substrate 112 is a substrate configured to support various components and materials disposed below the upper substrate 112. The upper substrate 112 may be formed by coating the lower substrate 111 and the first plate pattern 121 with a material, which constitutes the upper substrate 112, and curing the material. The upper substrate 112 may be disposed to adjoin the lower substrate 111, the first plate pattern 121, the first line pattern 122, and the connection lines 181 and 182.

The upper substrate 112 may be made of the same material as the lower substrate 111. For example, the upper substrate 112 may be made of silicone rubber such as polydimethylsiloxane (PDMS) or elastomer such as polyurethane (PU) or polytetrafluoroethylene (PTFE) and thus have flexibility. However, the material of the upper substrate 112 is not limited thereto.

Meanwhile, although not illustrated in FIG. 5, a polarizing layer may be disposed on the upper substrate 112. The polarizing layer may serve to polarize light entering from the outside of the display panel 100 of the display device and reduce reflection of external light. In addition, other optical films and the like other than the polarizing layer may be disposed on the upper substrate 112.

In addition, the filling layer 190 may be disposed on the front surface of the lower substrate 111 and fill portions between the components and materials disposed on the upper substrate 112 and the lower substrate 111. The filling layer 190 may be made of a curable bonding agent. For example, the filling layer 190 may be formed by coating the front surface of the lower substrate 111 with a material and curing the material to form the filling layer 190. The filling layer 190 may be disposed between the components and materials disposed on the upper substrate 112 and the lower substrate 111. For example, the filling layer 190 may be an optically clear adhesive (OCA) and made of an acrylic-based bonding agent, a silicon-based bonding agent, a urethane-based bonding agent, and the like.

Circuit Structure of Display Area

Figure 8:
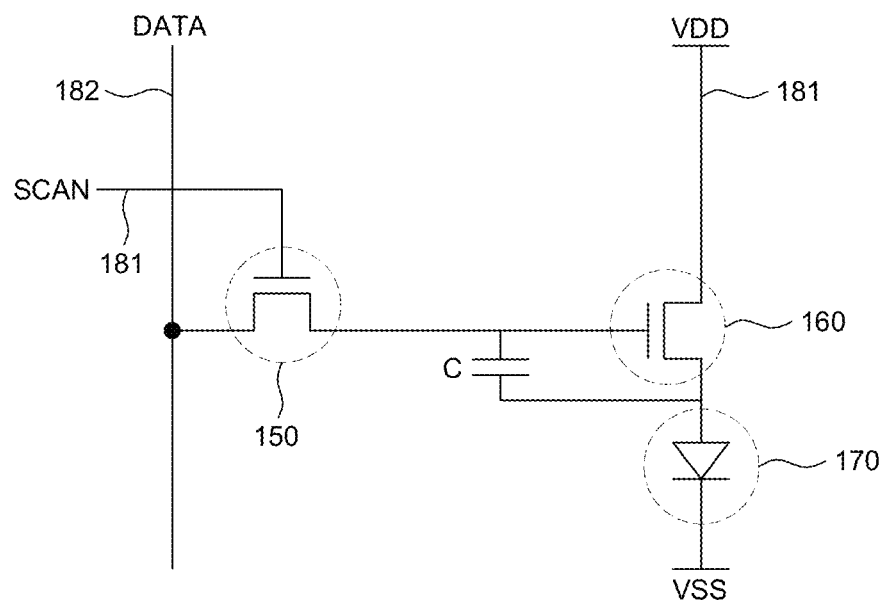
FIG. 8 is a circuit diagram of a subpixel of the display panel of the display device according to the aspect of the present disclosure.

FIG. 8 is a circuit diagram of the subpixel of the display panel of the display device according to the aspect of the present disclosure.

Hereinafter, for convenience of description, a structure and operation of the pixel circuit with a 2T (Transistor) 1C (Capacitor) structure configured by the subpixel SPX of the display panel of the display device according to the aspect of the present disclosure will be described. However, the present disclosure is not limited thereto.

With reference to FIGS. 5 and 8, the subpixel SPX of the display panel of the display device according to the aspect of the present disclosure may include the switching transistor 150, the driving transistor 160, a storage capacitor C, and the LED 170.

The switching transistor 150 applies a data signal DATA, which is supplied through the second connection line 182, to the driving transistor 160 and the storage capacitor C in response to a gate signal SCAN supplied through the first connection line 181.

The gate electrode 151 of the switching transistor 150 is electrically connected to the first connection line 181, the source electrode 153 of the switching transistor 150 is connected to the second connection line 182, and the drain electrode 154 of the switching transistor 150 is connected to the gate electrode 161 of the driving transistor 160.

The driving transistor 160 generates a drive current according to the data voltage DATA stored in the storage capacitor C and high-potential power VDD supplied through the first connection line 181.

Further, the gate electrode 161 of the driving transistor 160 is electrically connected to the drain electrode 154 of the switching transistor 150, the source electrode of the driving transistor 160 is connected to the first connection line 181, and the drain electrode 164 of the driving transistor 160 is connected to the LED 170.

The LED 170 may operate to emit light in response to a drive current generated by the driving transistor 160. Further, as described above, the n-electrode 174 of the LED 170 may be connected to the first connection line 181, and low-potential power VSS may be applied to the n-electrode 174. The p-electrode 175 of the LED 170 may be connected to the drain electrode 164 of the driving transistor 160, and a drive voltage corresponding to the drive current may be applied to the p-electrode 175.

The subpixel SPX of the display panel of the display device according to the aspect of the present disclosure has the 2T1C structure including the switching transistor 150, the driving transistor 160, the storage capacitor C, and the LED 170. However, in case that a compensating circuit is added, the subpixel may have various configurations such as 3T1C, 4T2C, 5T2C, 6T1C, 6T2C, 7T1C, 7T2C, or the like.

As described above, the display panel of the display device according to the aspect of the present disclosure may include the plurality of subpixels disposed on the first substrate, which is a rigid pattern, and the plurality of subpixels SPX may each include the switching transistor, the driving transistor, the storage capacitor, and the LED.

Therefore, the display panel of the display device according to the aspect of the present disclosure may be stretched by the lower substrate, and the pixel circuit having the 2T1C structure may be provided on the first substrate, such that the display panel may emit light according to the data voltage in accordance with the gate timing.

Structure of Touch Panel

Figure 9:
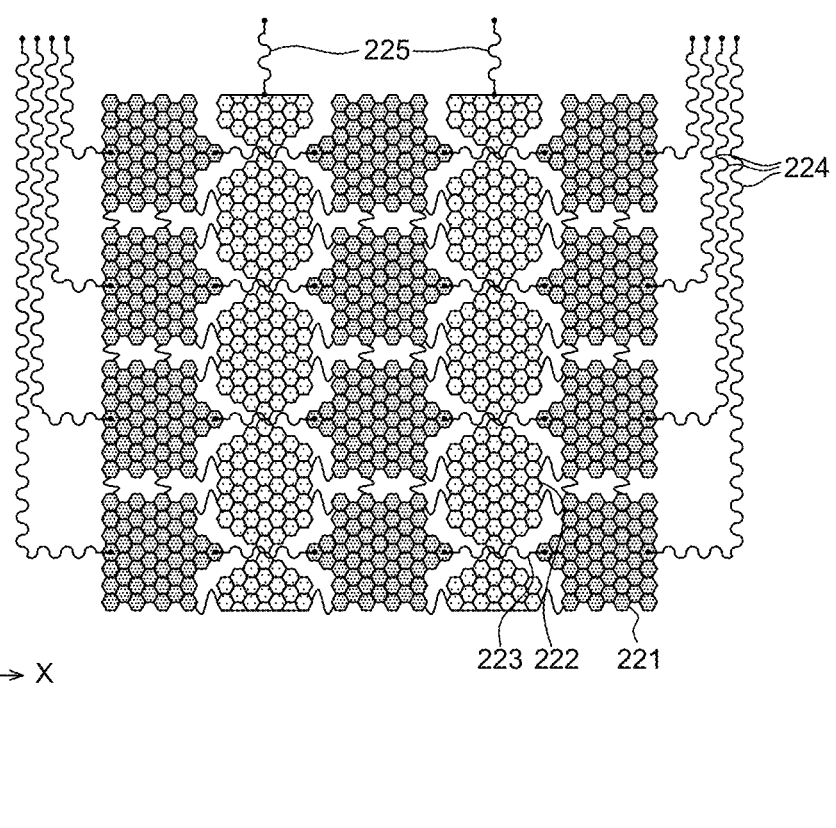
FIG. 9 is a top plan view of a touch panel of the display device according to the aspect of the present disclosure.

FIG. 9 is a top plan view of the touch panel of the display device according to the aspect of the present disclosure.

As illustrated in FIG. 9, the touch panel 200 may include a plurality of touch electrodes 221 and 222, a bridge line 223, and a plurality of routing lines 224 and 225.

The plurality of touch electrodes 221 and 222 may include a plurality of first touch electrodes 221 extending in the first direction X, and a plurality of second touch electrodes 222 extending in the second direction Y. Further, the plurality of first touch electrodes 221 and the plurality of second touch electrodes 222 may be formed as metal layers disposed on the same layer. The first touch electrodes 221 may be electrically connected by the bridge line 223 extending in the first direction X. The second touch electrodes 222 may be electrically connected without a separate bridge line. The bridge line 223 may be formed as a metal layer disposed on a layer different from the layers on which the first touch electrode 221 and the plurality of second touch electrodes 222 are disposed.

The plurality of touch electrodes 221 and 222 may be configured as a plurality of unit electrodes. Specifically, the plurality of unit electrodes, which constitutes the plurality of touch electrodes 221 and 222, may each have a hexagonal shape. However, the present disclosure is not limited thereto. The plurality of unit electrodes may each be modified in a circular shape or a polygonal shape such as an octagonal shape. The plurality of touch electrodes 221 and 222 may each have a honeycomb shape.

Therefore, the plurality of unit electrodes may each have an empty space such that the plurality of unit electrodes may be stretched or contracted in the first direction X and the second direction Y. The first touch electrode 221, which is configured as the plurality of unit electrodes, may also extend in the first direction X and the second direction Y.

Meanwhile, the configuration has been described in which all the plurality of touch electrodes 221 and 222 is configured as the plurality of unit electrodes. However, the plurality of unit electrodes may be defined to be divided into the plurality of first unit electrodes, which constitutes the first touch electrodes 221, and a plurality of second unit electrodes that constitutes the second touch electrode 222. However, the present disclosure is not limited thereto.

With reference to FIG. 9, the touch panel 200 may further include first routing lines 224 electrically connected to the first touch electrode 221, and second routing lines 225 electrically connected to the second touch electrode 222.

For example, the plurality of first routing lines 224 are respectively connected to two opposite sides of the first touch electrode 221 based on the first direction X, and the second routing lines 225 are each connected to one side of the second touch electrode 222 based on the second direction Y.

In some aspects, touch driving signals may be transmitted to the first touch electrodes 221 through the plurality of first routing lines 224. Touch detection signals, which are applied to the second touch electrodes 222, may be transmitted to a touch driver through the plurality of second routing lines 225.

Therefore, the plurality of first touch electrodes 221 may each serve as a touch transmitting electrode Tx configured to apply a touch driving signal, and the plurality of second touch electrodes 222 may each serve as a touch receiving electrode Rx to which a touch detection signal is applied.

In some other aspects, the touch detection signal is applied to the first touch electrode 221, may be transmitted to the touch driver through each of the plurality of first routing lines 224, and the touch driving signal may be transmitted to the second touch electrode 222 through each of the plurality of second routing lines 225. In this case, the plurality of first touch electrodes 221 may each serve as the touch receiving electrode Rx to which the touch detection signal is applied. The plurality of second touch electrodes 222 may each serve as the touch transmitting electrode Tx to which the touch driving signal is applied.

Further, the bridge line 223, the first routing line 224, and the second routing line 225 each have a curved shape. For example, the bridge line 223, the first routing line 224, and the second routing line 225 may each have a sinusoidal shape. However, the shape of each of the bridge line 223, the first routing line 224, and the second routing line 225 is not limited thereto. For example, the bridge line 223, the first routing line 224, and the second routing line 225 may each extend in a zigzag shape. Alternatively, the bridge line 223, the first routing line 224, and the second routing line 225 may each have various shapes such as a shape in which a plurality of rhombic substrates is connected at vertices.

Therefore, the bridge line 223, the first routing line 224, and the second routing line 225 may be stretched, such that the touch panel 200 may also be stretched.

The plurality of touch electrodes 221 and 222, the bridge line 223, and the plurality of routing lines 224 and 225, which constitute the touch panel 200, may each be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the plurality of touch electrodes 221 and 222, the bridge line 223, and the plurality of routing lines 224 and 225 may each be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

In this case, stress that is applied to the touch electrodes 221 and 222 during stretching may be dispersed though the touch panel 200. Therefore, stretching reliability of the touch panel of the display device according to the aspect of the present disclosure may be improved.

Structure of Touch Driver

Figure 10:
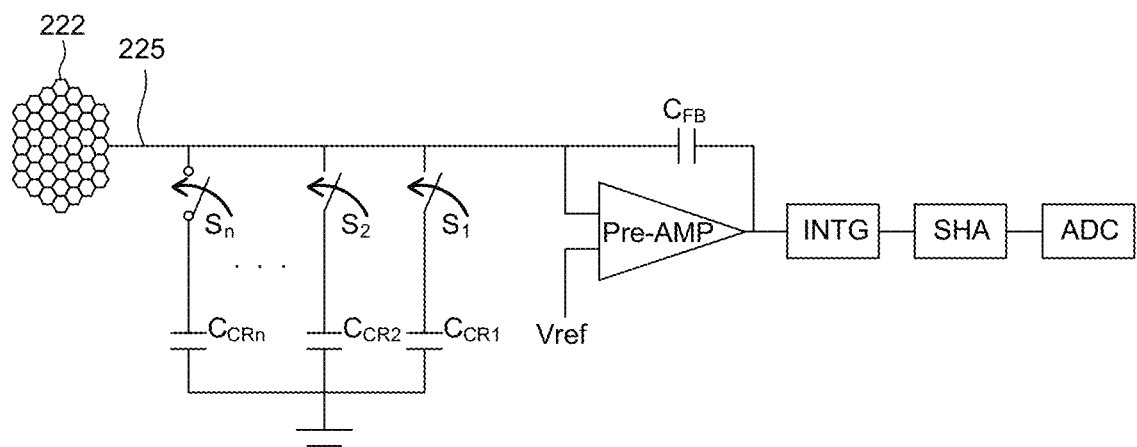
FIG. 10 is a view for explaining a touch driver of the display device according to the aspect of the present disclosure.

FIG. 10 is a view for explaining the touch driver of the display device according to the aspect of the present disclosure.

Figure 11:
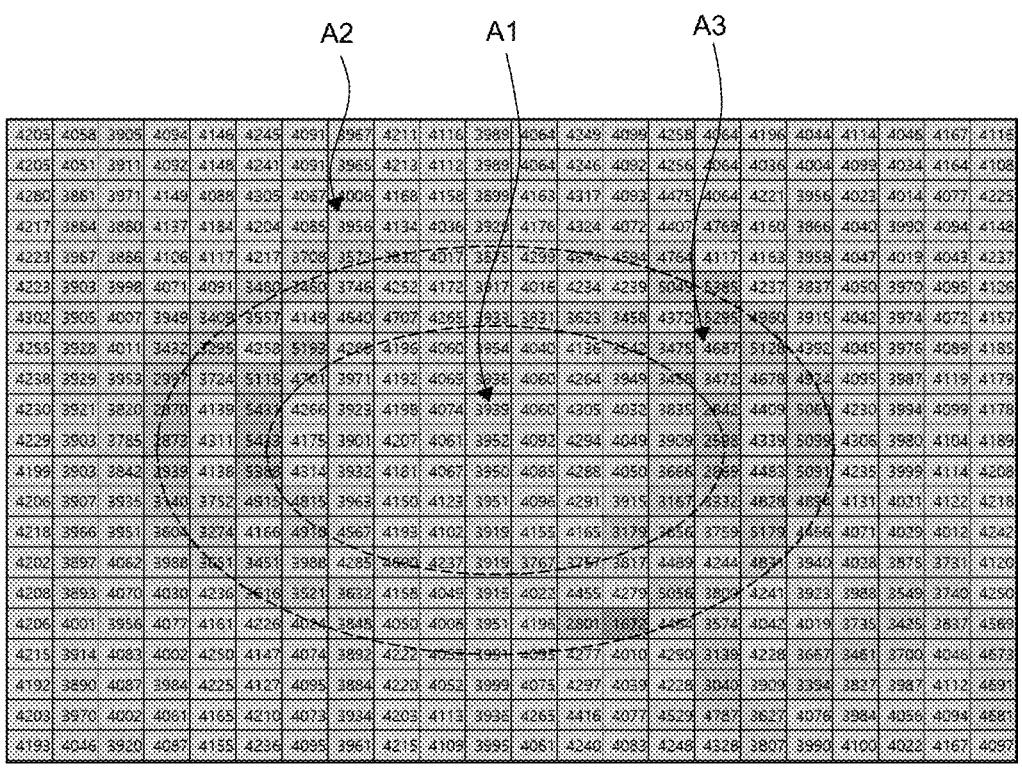
FIG. 11 is a view illustrating a level of touch data before correction is performed on the touch panel of the display device according to the aspect of the present disclosure.

FIG. 11 is a view illustrating a level of touch data before correction is performed on the touch panel 200 of the display device according to the aspect of the present disclosure.

In the display device according to the aspect of the present disclosure, the touch driver may detecting stretching of the touch panel 200 and correct a touch data value of the stretchable area of the touch panel 200.

To this end, the touch driver includes a plurality of capacitors $C_{CR1}$, $C_{CR2}$, ... $C_{CRn}$, a plurality of switches $S_1$, $S_2$, ... $S_n$, a preamplifier Pre-AMP, an integrator INTG, and a sample-and-hold circuit (SHA).

The plurality of capacitors $C_{CR1}$, $C_{CR2}$, ... $C_{CRn}$ may be electrically connected to the second touch electrode 222 through the second routing line 225.

For example, the plurality of capacitors $C_{CR1}$, $C_{CR2}$, ... $C_{CRn}$ may each be connected to the second routing line 225 in parallel through each of the plurality of switches $S_1$, $S_2$, ... $S_n$.

the plurality of switches $S_1$, $S_2$, ... $S_n$ may also respectively switch the plurality of capacitors $C_{CR1}$, $C_{CR2}$, ... $C_{CRn}$.

In this case, the plurality of switches $S_1$, $S_2$, ... $S_n$ may each be disposed between the second routing line 225 and each of the plurality of capacitors $C_{CR1}$, $C_{CR2}$, ... $C_{CRn}$.

For example, a first switch $S_1$ is connected between the second routing line 225 and a first capacitor $C_1$. Further, a second switch $S_2$ is connected between the second routing line 225 and a second capacitor $C_2$. Further, an nth switch $S_n$ is connected between the second routing line 225 and an nth capacitor $C_n$.

Therefore, the first switch $S_1$ may connect the first capacitor $C_1$ to the second routing line 225 or may not connect the first capacitor $C_1$ to the second routing line 225 by performing a switching operation. Further, the second switch $S_2$ may connect the second capacitor $C_2$ to the second routing line 225 or may not connect the second capacitor $C_2$ to the second routing line 225 by performing a switching operation. Further, the nth switch $S_n$ may connect the nth capacitor $C_n$ to the second routing line 225 or may not connect the nth capacitor $C_n$ to the second routing line 225 by performing a switching operation.

The preamplifier Pre-AMP stores electric charges corresponding to the capacitor between the second touch electrode 222 and a touch object. For example, the electric charges, which correspond to the capacitor formed between the second touch electrode 222 and the touch object, are stored in a feedback capacitor $C_FB$ of the preamplifier Pre-AMP.

At least one of the plurality of capacitors $C_{CR1}$, $C_{CR2}$, ... $C_{CRn}$ may be connected to the second routing line 225 by the switching operation of each of the plurality of switches $S_1$, $S_2$, ... $S_n$.

In this case, the electric charges may be stored in at least one of the plurality of capacitors ($C_{CR1}$, $C_{CR2}$, ... $C_{CRn}$) that are electrically connected to the second touch electrode 222. The electric charge stored in the capacitor formed between the second touch electrode 222 and the touch object may decrease based on the parallel combination of the capacitors.

That is, because the plurality of capacitors ($C_{CR1}$, $C_{CR2}$, ... $C_{CRn}$) are electrically connected to the second touch electrode 222, the plurality of capacitors may remove the electric charge formed between the second touch electrode 222 and the touch object. In this case, the plurality of capacitors may be referred to as an electric charge removing capacitor $C_n$.

In other words, the number of capacitors C connected to the second routing line may be controlled by the switching operations of the plurality of switches $S_1$, $S_2$, ... $S_n$. Therefore, the number of electric charges stored in the feedback capacitor $C_FB$ of the preamplifier Pre-AMP may be controlled, such that a level of a touch voltage, which is an output voltage of the preamplifier Pre-AMP, may be controlled.

The integrator INTG outputs an integrated value of the touch voltage of the output voltage of the preamplifier Pre-AMP.

The integrator INTG may include elements such as a comparator and a capacitor. The signal outputted from the integrator INTG is inputted to the sample-and-hold circuit SHA.

The sample-and-hold circuit SHA is a circuit that samples and maintains the integral value of the touch voltage and maintains the integral value of the touch sensing signal without change until an analog-digital converter ADC completes transfer conversion.

The analog-digital converter ADC converts an inputted analog touch voltage to digital touch data and outputs the digital touch data.

Further, touch information on whether a touch is made and touch information on a touch position are determined on the basis of the outputted digital touch data.

If the touch panel 200 is deformed by the actuator ACT as illustrated in FIGS. 2A and 2B, the plurality of touch electrodes 221 and 222, which is disposed in the third area A3 that is a stretchable area, may be deformed.

For example, a width between the plurality of touch electrodes 221 and 222 disposed in the third area A3 may decrease, and the plurality of touch electrodes 221 and 222 may deform to be longer in at least one direction.

Therefore, the capacitance, which is formed on the plurality of touch electrodes 221 and 222 disposed in the third area A3 that is the stretchable area, may change based on the deformation. Therefore, even though a touch is not input, the touch data output from the third area A3 (e.g., the stretchable area), may be different from the touch data output from the non-stretchable areas (e.g., the first area A1 and the second area A2).

For example, as illustrated in FIG. 11, a level of the touch data, which are outputted from the third area A3 that is the stretchable area, may be higher or lower than a level of the touch data outputted from the first area A1 and the second area A2 that are the non-stretchable areas.

That is, the uniformity of the touch data from the third area A3 may be degraded.

Therefore, the display device according to the aspect of the present disclosure may adjust the level of the touch data outputted from the third area A3 by adjusting the number of capacitors $C_{CR1}$, $C_{CR2}$, ... $C_{CRn}$ connected to the touch electrodes 221 and 222 by the switching operations of the plurality of switches $S_1$, $S_2$, ... $S_n$.

Hereinafter a method of driving the display device according to the aspect of the present disclosure will be described with reference to FIG. 12.

Figure 12:
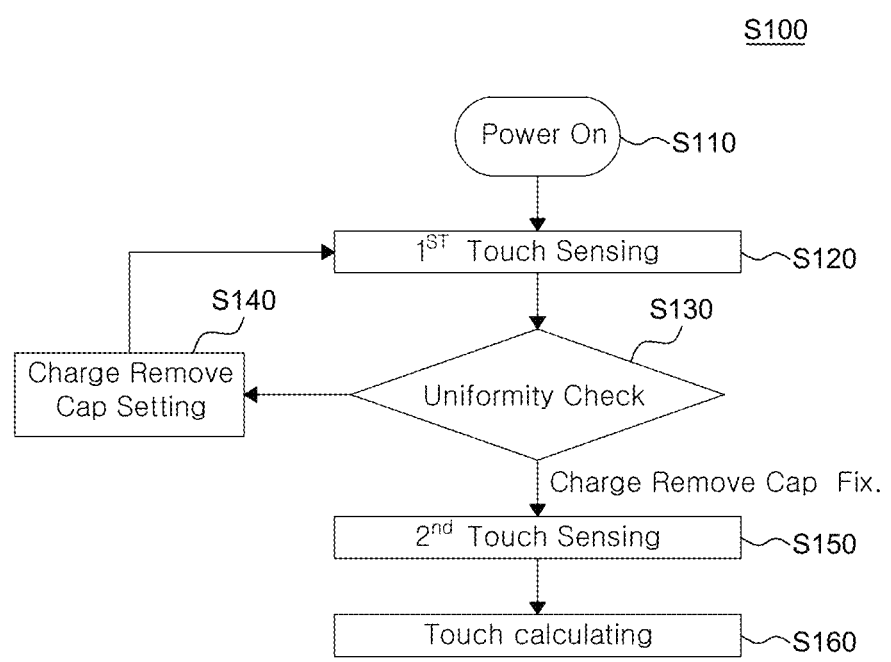
FIG. 12 is a flowchart for explaining a method of driving the display device according to the aspect of the present disclosure.

FIG. 12 is a flowchart for explaining a method of driving the display device according to the aspect of the present disclosure.

Figure 13A:
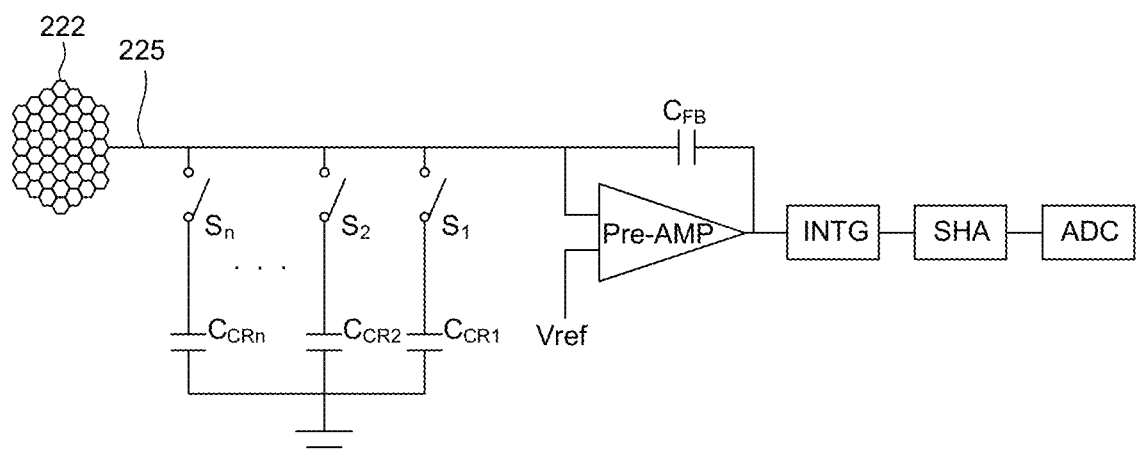
FIGS. 13A and 13B are views for explaining an operation of the touch driver of the display device according to the aspect of the present disclosure.
Figure 13B:
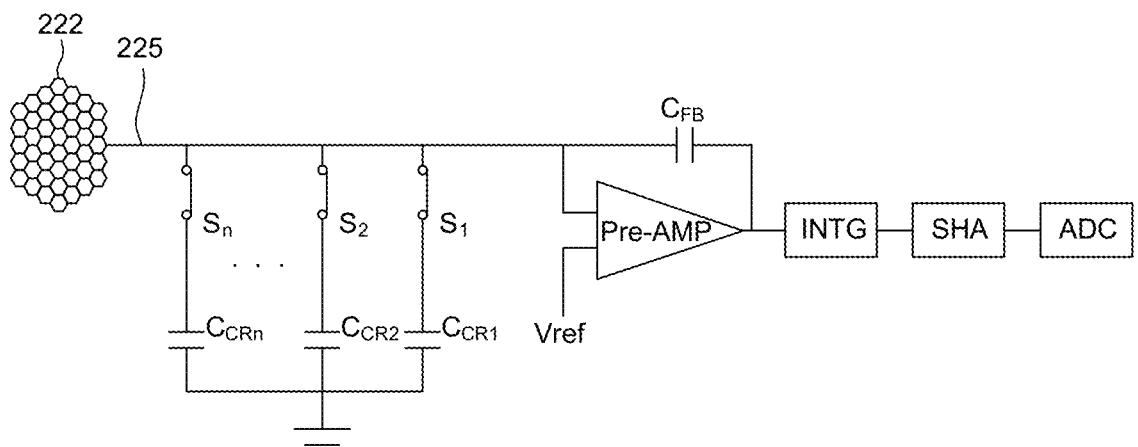

FIGS. 13A and 13B are views for explaining an operation of the touch driver of the display device according to the aspect of the present disclosure.

Figure 14:
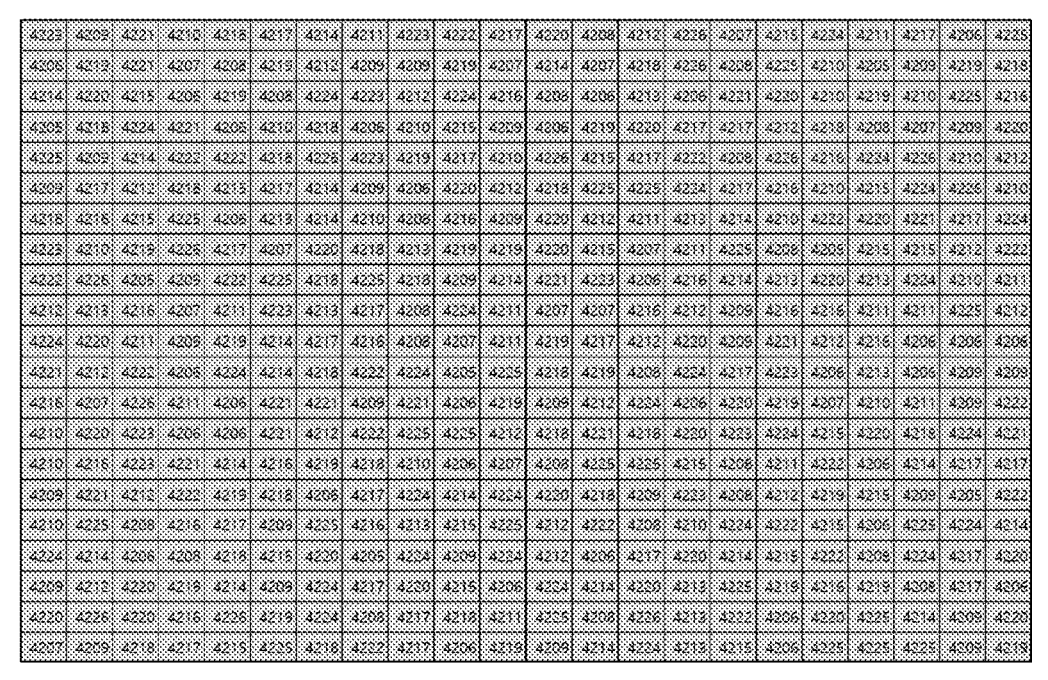

FIG. 14 is a view illustrating a level of the touch data after the correction is performed on the touch panel of the display device according to the aspect of the present disclosure.

A method S100 of driving the display device according to the aspect of the present disclosure includes a power-on step S110, a first touch sensing step S120, a uniformity check step S130, an electric charge removing capacitor setting step S140, a second touch sensing step S150, and a touch coordinate calculating step S160.

In the power-on step S110, the display panel 100 is turned on, and the actuator ACT operates, such that portions of the display panel 100 and the touch panel 200 may protrude.

For example, with reference to FIGS. 2A and 2B, the first area A1 and the second area A2 may not be stretched, but the third area A3 may be stretched, such that the touch electrodes 221 and 222 may be partially deformed.

Further, in the first touch sensing step S120, the touch data may be calculated in all the areas A1, A2, and A3 of the touch panel 200.

That is, the touch data may be calculated in the first area A1, the second area A2, and the third area A3 of the touch panel 200.

Further, in the uniformity check step S130, the uniformity of the touch data may be identified for the first area A1, the second area A2, and the third area A3.

For example, as illustrated in FIG. 11, the touch data is calculated in the first area A1 and the second area A2 that are the non-stretchable areas and may be uniform. However, the touch data of the stretchable third area A3 may not be uniform.

For example, the touch data in the first area A1 and the second area A2 may have high uniformity within a range of 3,900 to 4,300.

In contrast, the touch data of the stretchable third area A3 may have low uniformity and ranges from 1,600 to 5,400.

Further, in the electric charge removing capacitor setting step, the number of capacitors $C_{CR1}$, $C_{CR2}$, ... $C_{CRn}$ connected to the plurality of touch electrodes 221 and 222 are controlled by the switching operations of the plurality of switches $S_1$, $S_2$, ... $S_n$ on the basis of the uniformity of the touch data.

That is, because the first area A1 and the second area A2, which are the non-stretchable areas, have high uniformity of the touch data, it may not be necessary to adjust the number of capacitors $C_{CR1}$, $C_{CR2}$, ... $C_{CRn}$ connected to the touch electrodes 221 and 222 in the first area A1 and the second area A2.

However, because the third area A3, which is the stretchable area, has low uniformity of the touch data, it is necessary to adjust the number of capacitors $C_{CR1}$, $C_{CR2}$, ... $C_{CRn}$ connected to the touch electrodes 221 and 222 in the third area A3.

In one case, it is possible to reduce the number of capacitors $C_{CR1}$, $C_{CR2}$, ... $C_{CRn}$ connected to the touch electrode 222 having the touch data measured to be relatively low in the third area A3.

For example, as illustrated in FIG. 13A, it is possible to reduce the number of capacitors $C_{CR1}$, $C_{CR2}$, ... $C_{CRn}$ connected to the touch electrode 222 by turning off the plurality of switches $S_1$, $S_2$, ... $S_n$ connected to the touch electrode 222 having the touch data measured to be relatively low in the third area A3.

Therefore, the electric charges, which correspond to the capacitor formed between the touch object and the touch electrode 222 having the touch data measured to be relatively low in the third area A3, are not removed, such that the level of the touch data may be adjusted to increase.

On the contrary, the number of capacitors $C_{CR1}$, $C_{CR2}$, ... $C_{CRn}$ connected to the touch electrode 222, which has the touch data measured to be relatively high in the third area A3, may increase.

For example, as illustrated in FIG. 13B, it is possible to increase the number of capacitors $C_{CR1}$, $C_{CR2}$, ... $C_{CRn}$ connected to the touch electrode 222 by turning on all the plurality of switches $S_1$, $S_2$, ... $S_n$ connected to the touch electrode having the touch data measured to be relatively high in the third area A3.

Therefore, the electric charges, which correspond to the capacitor formed between the touch object and the touch electrode having the touch data measured to be relatively high in the third area A3, are maximally removed, such that the level of the touch data may be adjusted to decrease.

Further, thereafter, in the uniformity check step S130, the uniformity of the touch data may be identified for the first area A1, the second area A2, and the third area A3.

Specifically, as illustrated in FIG. 14, the touch data calculated in the first area A1, the second area A2, and the third area A3 may be uniform.

For example, the uniformity of the touch data calculated in the first area A1, the second area A2, and the third area A3 may increase to a level of about 4,200 to 4,300.

That is, because the number of capacitors C respectively corresponding to the plurality of touch electrodes 222 has been adjusted in the electric charge removing capacitor setting step S140, the uniformity of the touch data may increase in the second touch sensing step.

Further, after the number of capacitors $C_{CR1}$, $C_{CR2}$, ... $C_{CRn}$ respectively connected to the plurality of touch electrodes 222 in the third area A3 is adjusted as described above, a predetermined value related to the number of capacitors $C_{CR1}$, $C_{CR2}$, ... $C_{CRn}$ respectively connected to the plurality of touch electrodes 222 in the third area A3 may be stored in a memory. In other words, the memory may store a preset value related to switching states (on/off states) of the plurality of switches $S_1$, $S_2$, ... $S_n$ respectively connected to the plurality of touch electrodes 222 in the third area A3 (Charge Remove Cap Fix.).

Further, the touch data may be calculated in the entire area of the touch panel 200 even in the second touch sensing step S150.

That is, the touch data may be calculated in the first area A1, the second area A2, and the third area A3 of the touch panel 200.

Further, in the touch computation step S160, a touch coordinate may be calculated based on the touch data calculated in the second touch sensing step S150.

Specifically, in the touch computation step S160, the number of capacitors $C_{CR1}$, $C_{CR2}$, ... $C_{CRn}$ respectively connected to the plurality of touch electrodes 222 is controlled depending on whether the touch panel 200 is stretched, such that the touch operation performed on the touch panel 200 may be computed.

For example, when the actuator ACT does not protrude, the touch panel 200 is not deformed without being stretched. Therefore, in this case, the switching state (on/off state) of each of the plurality of switches $S_1$, $S_2$, ... $S_n$ is set to a first state. The touch coordinate according to the touch operation performed on the touch panel 200 may be computed by adjusting the number of capacitors $C_{CR1}$, $C_{CR2}$, ... $C_{CRn}$, which are respectively connected to the plurality of touch electrodes 222, to a first setting value.

The first state is an initial switching state (on/off state) of each of the plurality of switches $S_1$, $S_2$, ... $S_n$ corresponding to when the touch panel 200 is not deformed without being stretched. Further, the first setting value indicates an initial number of capacitors $C_{CR1}$, $C_{CR2}$, ... $C_{CRn}$ respectively connected to the plurality of touch electrodes 222 in case that the touch panel 200 is not deformed without being stretched.

On the contrary, the touch panel 200 is stretched and deformed when the actuator ACT protrudes. Therefore, in this case, the switching state (on/off state) of each of the plurality of switches $S_1$, $S_2$, ... $S_n$ is set to a second state. The touch coordinate according to the touch operation performed on the touch panel 200 may be computed by adjusting the number of capacitors $C_{CR1}$, $C_{CR2}$, ... $C_{CRn}$, which are respectively connected to the plurality of touch electrodes 222, to a second setting value.

The second state corresponds to a changed switching state (on/off state) of each of the plurality of switches $S_1$, $S_2$, ... $S_n$ in case that the touch panel 200 is stretched and deformed. Further, the second setting value means a changed number of capacitors $C_{CR1}$, $C_{CR2}$, ... $C_{CRn}$ respectively connected to the plurality of touch electrodes 222 in case that the touch panel 200 is stretched and deformed.

Therefore, in the display device according to the aspect of the present disclosure, the touch data calculated by the plurality of touch electrodes 222 may not be distorted even though the touch panel 200 is deformed.

That is, in the display device according to the aspect of the present disclosure, the touch performance may be improved not only in the non-stretched state of the touch panel 200 but also in the stretched state of the touch panel 200.

The exemplary aspects of the present disclosure may also be described as follows:

According to an aspect of the present disclosure, a display device includes: a stretchable touch panel having a plurality of touch electrodes; a stretchable display panel configured to display an image; and a touch driver configured to operate the touch panel, in which the touch driver recognizes a stretchable area of the touch panel and corrects a touch data value of the stretchable area of the touch panel, thereby improving touch performance of the stretchable touch panel.

The touch driver may comprise at least one capacitor connected to the plurality of touch electrodes through a routing line, at least one switch configured to switch the at least one capacitor, a preamplifier configured to store electric charges applied to the plurality of touch electrodes, an integrator configured to integrate a touch voltage that is an output value of the preamplifier; a sample-and-hold circuit configured to sample an integral value of the touch voltage; and an analog-digital converter ADC configured to convert the integral value of the touch voltage into touch data.

The at least one capacitor is connected to the routing line in parallel through the at least one switch.

The at least one switch may be disposed between the routing line and the at least one capacitor.

The at least one switch selectively may connect or may not connect the routing line and the at least one capacitor by a switching operation.

The touch driver may turn off the at least one switch connected to the touch electrode having a level of the touch data that is measured to be lower than an average.

The touch driver may turn on the at least one switch connected to the touch electrode having a level of the touch data that is measured to be higher than an average.

The display device may comprise an actuator configured to deform the display panel and the touch panel, wherein the display panel and the touch panel each may comprise a first area configured to be allowed to protrude by the actuator; a second area configured to not be allowed to protrude by the actuator; and a third area disposed between the first area and the second area, and wherein the third area is the stretchable area.

A switching state of the at least one switch may be set to a first state in a state in which the actuator does not protrude, and wherein the switching state of the at least one switch may be set to a second state different from the first state in a state in which the actuator protrudes.

A plurality of pixels and a connection line may be disposed in the first and second areas of the display panel, and wherein a plurality of connection lines is disposed in the third area of the display panel and connects the plurality of pixels disposed in the first area and the plurality of pixels disposed in the second area, and a plurality of pixels are not disposed in the third area of the display panel.

According to another aspect of the present disclosure, a method of driving a display device, which includes a stretchable touch panel having a plurality of touch electrodes, a stretchable display panel configured to display an image, an actuator configured to deform the display panel and the touch panel, and a touch driver having at least one electric charge removing capacitor configured to be switched by at least one switch, includes: a power-on step of operating the actuator; a first touch sensing step of calculating touch data in all areas of the touch panel; a uniformity check step of calculating uniformity of the touch data; an electric charge removing capacitor setting step of setting the number of electric charge removing capacitors respectively connected to the plurality of touch electrodes on the basis of the uniformity of the touch data; a second touch sensing step of calculating the touch data in all the areas of the touch panel; and a touch coordinate calculating step of calculating a touch coordinate on the basis of the touch data calculated in the second touch sensing step.

In the electric charge removing capacitor setting step, the number of electric charge removing capacitors connected to the touch electrode disposed in a stretchable area of the touch panel may be adjusted.

In the electric charge removing capacitor setting step, the number of electric charge removing capacitors connected to the touch electrode having a level of the touch data, which is measured to be lower than an average, may be decreased.

The electric charge removing capacitor setting step, the number of electric charge removing capacitors connected to the touch electrode having a level of the touch data, which is measured to be higher than an average, may be increased.

In the touch coordinate calculating step, a touch coordinate may be calculated by setting the number of electric charge removing capacitors respectively connected to the plurality of touch electrodes to a first setting value when the touch panel is not stretched, and the touch coordinate is calculated by setting the number of electric charge removing capacitors respectively connected to the plurality of touch electrodes to a second setting value when the touch panel is stretched.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. All the technical concepts in the equivalent scope of the present disclosure should be construed as falling within the scope of the present disclosure.

What is claimed is:

1. A display device comprising:
   a stretchable touch panel having a plurality of touch electrodes;
   a stretchable display panel configured to display an image; and
   a touch driver configured to operate the stretchable touch panel,
   wherein the touch driver recognizes a stretchable area of the stretchable touch panel and corrects a touch data value of the stretchable area of the stretchable touch panel,
   wherein the touch driver comprises:
      at least one capacitor connected to the plurality of touch electrodes through a routing line;
      at least one switch configured to switch the at least one capacitor;
      a preamplifier configured to store electric charges applied to the plurality of touch electrodes;
      an integrator configured to integrate a touch voltage that is an output value of the preamplifier;
      a sample-and-hold circuit configured to sample an integral value of the touch voltage; and
      an analog-digital converter ADC configured to convert the integral value of the touch voltage into touch data, and wherein the at least one capacitor is connected to the routing line in parallel through the at least one switch.

2. The display device of claim 1, wherein the at least one switch is disposed between the routing line and the at least one capacitor.

3. The display device of claim 1, wherein the at least one switch selectively connects or does not connect the routing line and the at least one capacitor by a switching operation.

4. The display device of claim 1, wherein the touch driver turns off the at least one switch connected to a touch electrode having a level of the touch data that is outside of a standard range.

5. The display device of claim 1, wherein the touch driver turns on the at least one switch connected to a touch electrode having a level of the touch data that is outside of a standard range.

6. The display device of claim 1, further comprising:
an actuator configured to deform the stretchable display panel and the stretchable touch panel,
wherein the stretchable display panel and the stretchable touch panel each comprise:
a first area configured to be allowed to protrude by the actuator;
a second area configured to not be allowed to protrude by the actuator; and
a third area disposed between the first area and the second area, and
wherein the third area is the stretchable area.

7. The display device of claim 6,
wherein a switching state of the at least one switch is set to a first state in a state in which the actuator does not protrude, and
wherein the switching state of the at least one switch is set to a second state different from the first state when the actuator protrudes.

8. The display device of claim 6,
wherein a plurality of pixels and a connection line are disposed in the first area and the second area of the stretchable display panel, and
wherein a plurality of connection lines are disposed in the third area of the stretchable display panel and connects the plurality of pixels disposed in the first area and the plurality of pixels disposed in the second area, and a pixel is not disposed in the third area of the stretchable display panel.

9. A method of driving a display device comprising a stretchable touch panel having a plurality of touch electrodes, a stretchable display panel configured to display an image, an actuator configured to deform the stretchable display panel and the stretchable touch panel, and a touch driver having at least one electric charge removing capacitor configured to be switched by at least one switch, the method comprising:
operating the actuator;
calculating first touch data in all areas of the stretchable touch panel;
calculating a uniformity of the first touch data;
setting a number of electric charge capacitors connected to the plurality of touch electrodes based on the uniformity of the first touch data;
calculating second touch data in all the areas of the stretchable touch panel; and
calculating a touch coordinate based on the second touch data.

10. The method of claim 9, wherein the number of the electric charge capacitors connected to a touch electrode disposed in a stretchable area of the stretchable touch panel is adjusted based on the first touch data.

11. The method of claim 10, further comprising, when the first touch data is lower than an average, increasing decreasing the number of the electric charge capacitors connected to the touch electrode.

12. The method of claim 10, further comprising, when the first touch data is higher than an average, increasing the number of the electric charge capacitors connected to the touch electrode having a level of the first touch data.

13. The method of claim 9, wherein the touch coordinate is calculated by setting the number of the electric charge capacitors respectively connected to the plurality of touch electrodes to a first setting value when the stretchable touch panel is not stretched, and the touch coordinate is calculated by setting the number of the electric charge capacitors respectively connected to the plurality of touch electrodes to a second setting value when the stretchable touch panel is stretched.

* * * * *